United States Patent
Kim et al.

(10) Patent No.: US 8,471,339 B2
(45) Date of Patent: Jun. 25, 2013

(54) SEMICONDUCTOR DEVICE AND RELATED METHOD OF FABRICATION

(75) Inventors: Yongdon Kim, Hwaseong-si (KR); Daeshik Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/175,976

(22) Filed: Jul. 5, 2011

(65) Prior Publication Data

US 2012/0037995 A1 Feb. 16, 2012

(30) Foreign Application Priority Data

Aug. 11, 2010 (KR) .......................... 10-2010-0077476

(51) Int. Cl.
 *H01L 21/70* (2006.01)
(52) U.S. Cl.
 USPC .......................................... 257/368; 257/547
(58) Field of Classification Search
 USPC .......................................... 257/368, 349, 547
 See application file for complete search history.

(56) References Cited

U.S. PATENT DOCUMENTS

| 6,794,717 B2 | 9/2004 | Matsumoto et al. |
| 2004/0119133 A1 | 6/2004 | Iwamatsu |

FOREIGN PATENT DOCUMENTS

| JP | 2002246600 | 8/2002 |
| JP | 2004200372 | 7/2004 |
| KR | 1020020066943 A | 8/2002 |
| KR | 1020040054468 A | 6/2004 |
| KR | 1020040067015 A | 7/2004 |
| KR | 1020060098191 A | 9/2006 |
| KR | 1020070069726 A | 7/2007 |

*Primary Examiner* — N Drew Richards
*Assistant Examiner* — Christina Sylvia
(74) *Attorney, Agent, or Firm* — Volentine & Whitt, PLLC

(57) ABSTRACT

A semiconductor device comprises a device isolation pattern, an active region, a gate pattern, a first source/drain region, and a first barrier region. The device isolation pattern defines an active portion in a semiconductor substrate and the active portion comprises first and second sidewalls extending in a first direction and doped with a first conductive type dopant. The gate pattern extends in a second direction perpendicular to the first direction to cross over the active portion. The first source/drain region and the first barrier region are disposed in the active portion at one side of the gate pattern. The first barrier region is disposed between the first source/drain region and the first sidewall and contacts the first sidewall. The first barrier region is doped with the first conductive type dopant and the first source/drain region is doped with a second conductive type dopant.

19 Claims, 43 Drawing Sheets

SEMICONDUCTOR DEVICE AND RELATED METHOD OF FABRICATION

CROSS-REFERENCE TO RELATED APPLICATIONS

This application claims priority under 35 U.S.C. §119 to Korean Patent Application No. 10-2010-0077476 filed on Aug. 11, 2010, the disclosure of which is hereby incorporated by reference in its entirety.

BACKGROUND OF THE INVENTION

Embodiments of the inventive concept relate to semiconductor devices and related methods of fabrication.

Semiconductor devices perform significant functions in a wide variety of technical applications, ranging from electronic equipment to cars and/or ships. Field effect transistors (hereinafter, transistors) are an important feature of many of these semiconductor devices.

A transistor typically comprises a source and a drain separated from each other on a semiconductor substrate, and a gate electrode covering a top of a channel region between the source and the drain. The source and the drain are formed by implanting dopant ions into the semiconductor substrate and the gate electrode is insulated from the channel region by a gate oxide layer interposed between the semiconductor substrate and the gate electrode. This type of transistor is extensively used as a switching device and/or a logic component of a semiconductor device.

As semiconductor technologies continue to evolve, there is a continuing need develop techniques for maintaining the reliability of transistors. Consequently, researchers continue to devote resources to developing such techniques.

SUMMARY OF THE INVENTION

According to one embodiment of the inventive concept, a semiconductor device comprises a device isolation pattern defining an active portion in a semiconductor substrate, the active portion comprising first and second sidewalls extending in a first direction and doped with a first conductive type dopant, and the first and second sidewalls facing each other, a gate pattern extending in a second direction perpendicular to the first direction to cross over the active portion, and a first source/drain region and a first barrier region disposed in the active portion at one side of the gate pattern. The first barrier region is disposed between the first source/drain region and the first sidewall and contacts the first sidewall, and the first barrier region is doped with the first conductive type dopant and the first source/drain region is doped with a second conductive type dopant.

According to another embodiment of the inventive concept, a method of fabricating a semiconductor device, comprises forming a device isolation pattern defining an active portion in a semiconductor substrate, the active portion comprising first and second sidewalls extending in a first direction and doped with a first conductive type dopant, the first and second sidewalls facing each other, forming a gate pattern extending in a second direction perpendicular to the first direction to cross over the active portion, and forming a first source/drain region and a first barrier region disposed in the active portion at one side of the gate pattern. The first barrier region is disposed between the first source/drain region and the first sidewall to contact the first sidewall, and the first barrier region is doped with the first conductive type dopant and the first source/drain region is doped with a second conductive type dopant.

According to still another embodiment of the inventive concept, a transistor, comprises an active portion formed in a semiconductor substrate and having first and second sidewalls extending in a first direction, a gate pattern formed on the active portion and extending in a second direction perpendicular to the first direction, a first source/drain region located on a first side of the gate pattern, a second source/drain region located on a second side of the gate pattern, a first barrier region formed between the first source/drain region and the first sidewall of the active portion, a second barrier region formed between the first source/drain region and the second sidewall of the active portion.

These and other embodiments of the inventive concept can improve the reliability of semiconductor devices by preventing leakage current from the first source/drain region.

BRIEF DESCRIPTION OF THE DRAWINGS

The drawings illustrate selected embodiments of the inventive concept. In the drawings, like reference numbers indicate like features. In addition, the dimensions of certain layers and regions are exaggerated for clarity of illustration.

DETAILED DESCRIPTION

Selected embodiments of the inventive concept are described below with reference to the accompanying drawings. These embodiments are presented as teaching examples and should not be construed to limit the scope of the inventive concept.

In the description that follows, where a feature is referred to as being 'on' another feature, it can be directly on the other feature, or intervening features may also be present. Similarly, where a layer is referred to as being 'under' another feature, it can be directly under, or intervening features may also be present. In addition, where a feature is referred to as being 'between' two layers, it can be the only feature between the other two features, or additional intervening features may also be present.

Although numerical terms such as first and a second are used to describe various features, the described features are not limited to these terms. Rather, these numerical terms are used merely to distinguish between different features.

Figure 1:
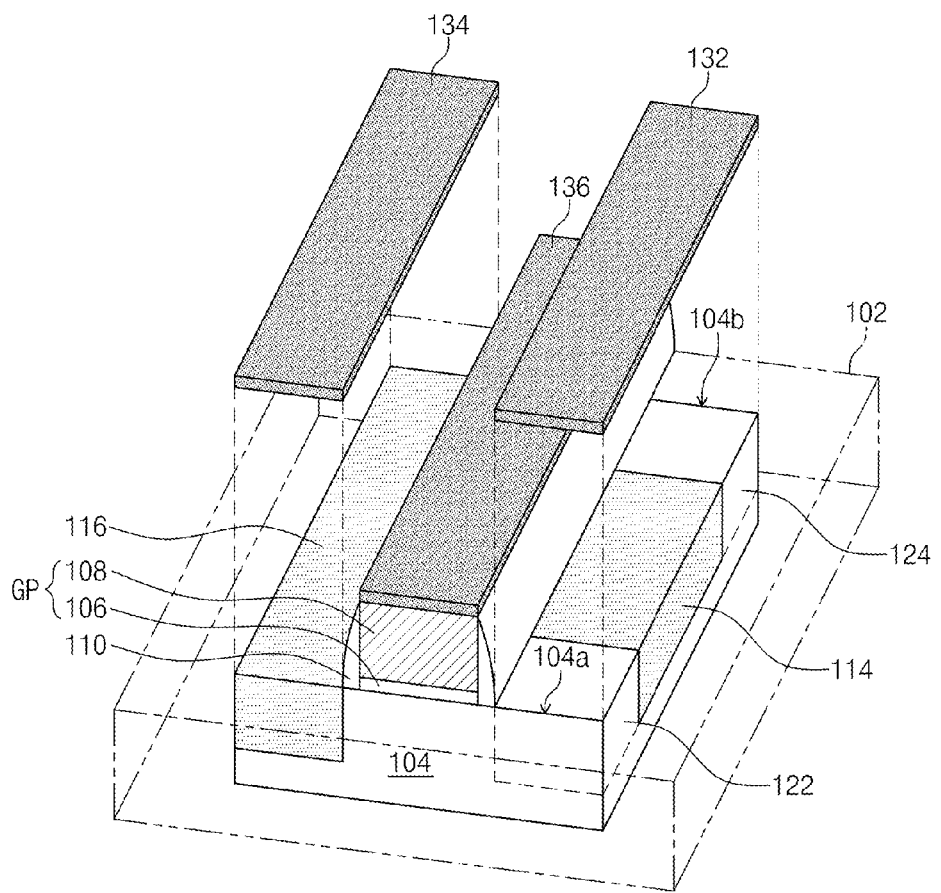
FIG. 1 is a perspective view illustrating a semiconductor device according to a first embodiment of the inventive concept.

FIG. 1 is a perspective view illustrating a semiconductor device according to a first embodiment of the inventive concept.

Referring to FIG. 1, a device isolation pattern 102 defining an active portion 104 is disposed on a semiconductor substrate 100 doped with a dopant of a first conductive type. Active portion 104 is a portion of semiconductor substrate 100 surrounded by device isolation pattern 102. Active portion 104 comprises a first sidewall 104a and a second sidewall 104b extending in parallel in a first direction. First sidewall 104a and second sidewall 104b are boundaries where active portion 104 and device isolation pattern 102 contact each other.

Semiconductor substrate 100 can be a silicon substrate, a germanium substrate, or a compound semiconductor substrate, for example. Device isolation pattern 102 can be a trench type device isolation pattern. In this case, device isolation pattern 102 can be formed by creating a trench in semiconductor substrate 100 and filling the trench with an insulation material.

A gate pattern GP is formed across a top surface of active portion 104. Gate pattern GP extends in a second direction perpendicular to the first direction, and it overlaps first sidewall 104b and second sidewall 104b. Gate pattern GP comprises a gate insulation layer 106 disposed on active portion 104 and a gate electrode 108 formed on gate insulation layer 106.

Gate insulation layer 106 comprises at least one of an oxide (e.g., a thermal oxide, etc.), a nitride, an oxynitride, and a high-k material (e.g., a metal oxide such as an aluminum oxide, a hafnium oxide, etc.). Gate electrode 108 comprises at least one of a doped semiconductor (e.g., doped silicon, doped germanium, etc.), a metal (e.g., tungsten, titanium, tantalum, etc.), a conductive metal nitride (e.g., nitride titanium, nitride tantalum, etc.), and a metal-semiconductor compound (e.g., tungsten silicide, cobalt silicide, etc.).

Spacers 110 are disposed on both sides of gate pattern GP. Spacers 110 each comprise an oxide layer, a nitride layer, and/or an oxynitride layer.

A first source/drain region 114, a first barrier region 122 and a second barrier region 124 are disposed in active portion 104 at one side of gate pattern GP. First barrier region 122 is disposed between first source/drain region 114 and first sidewall 104a, and second barrier region 124 is disposed between first source/drain region 114 and second sidewall 104b. Accordingly, first source/drain region 114 is spaced from first sidewall 104a and second sidewall 104b. First barrier region 122, first source/drain region 114, and second barrier region 124 are sequentially disposed from first sidewall 104a. First and second barrier regions 122 and 124 contact first and second sidewalls 104a and 104b, respectively.

First source/drain region 114 is doped with a dopant of a second conductive type and first and second barrier regions 122 and 124 are doped with a dopant of the first conductive type. First barrier region 122 is not doped with the second conductive type dopant and it constitutes a portion of active portion 104 disposed between first source/drain region 114 and first sidewall 104a. Second barrier region 124 is not doped with the second conductive type dopant and it constitutes a portion of active portion 104 disposed between first source/drain region 114 and second sidewall 104b. Accordingly, a concentration of the first conductive type dopant of first and second barrier regions 122 and 124 is substantially the same as that of active portion 104.

A second source/drain region 116 is disposed in active portion 104 at the other side of gate pattern GP. Second source/drain region 116 is doped with the second conductive type dopant. Second source/drain region 116 contacts first sidewall 104a and second sidewall 104b. In the second direction, the length of second source/drain region 116 is longer than that of first source/drain region 114.

A first silicide pattern 132 covers first source/drain region 114 and first and second barrier regions 122 and 124. A second silicide pattern 134 covers second source/drain region 116. A third silicide pattern 136 covers gate electrode 108. First through third silicide patterns 132, 134, and 136 each comprise a metal silicide. The metal silicide can be one of tungsten silicide, titanium silicide, cobalt silicide, and tantalum silicide, for example.

A channel region is defined in active portion 104 below gate pattern GP. The channel region comprises a first edge area adjacent to first sidewall 104a of active portion 104, a second edge area adjacent to second sidewall 104b, and a middle area between the first and second edge areas.

In the first embodiment of the inventive concept, first source/drain region 114 is spaced apart from first sidewall 104a of active portion 104 by first barrier region 122 doped with the same conductive type dopant as active portion 104. Accordingly, first source/drain region 114 is spaced apart from the first edge area of the channel region by first barrier region 122. In other words, first barrier region 122 is disposed between the first edge area of the channel region and first source/drain region 114. As a result, even where a leakage current occurs through the first edge area of the channel region, first barrier region 122 prevents the leakage current from flowing into first source/drain region 114. That is, first barrier region 122 serves as a barrier to the leakage current. Similarly, a leakage current occurring through the second edge area of the channel region is cut off by second barrier region 124. As a result, the semiconductor device has relatively high reliability.

The first and second edge areas include the top surface of active portion 104 and edges where first and second sidewalls 104a and 104b meet. While the transistor operates, the first and second edge areas are turned on before the middle area. As a result, the threshold voltages of the first and second edge areas may be lower than that of the middle area. This occurs because an electric field is concentrated on the edges and/or dopant elements in the channel region are segregated into device isolation pattern 102. Where first source/drain region 114 contacts first sidewall 104a, a leakage current through the first edge area flows into first source/drain region 114 so that characteristics of the semiconductor device are deteriorated.

However, as mentioned above, because first source/drain region 114 is spaced apart from first and second sidewalls 104a and 104b by first and second barrier regions 122 and 124, a leakage current through the first and second edge areas is prevented. As a result, the semiconductor device has relatively high reliability.

Figure 2A:
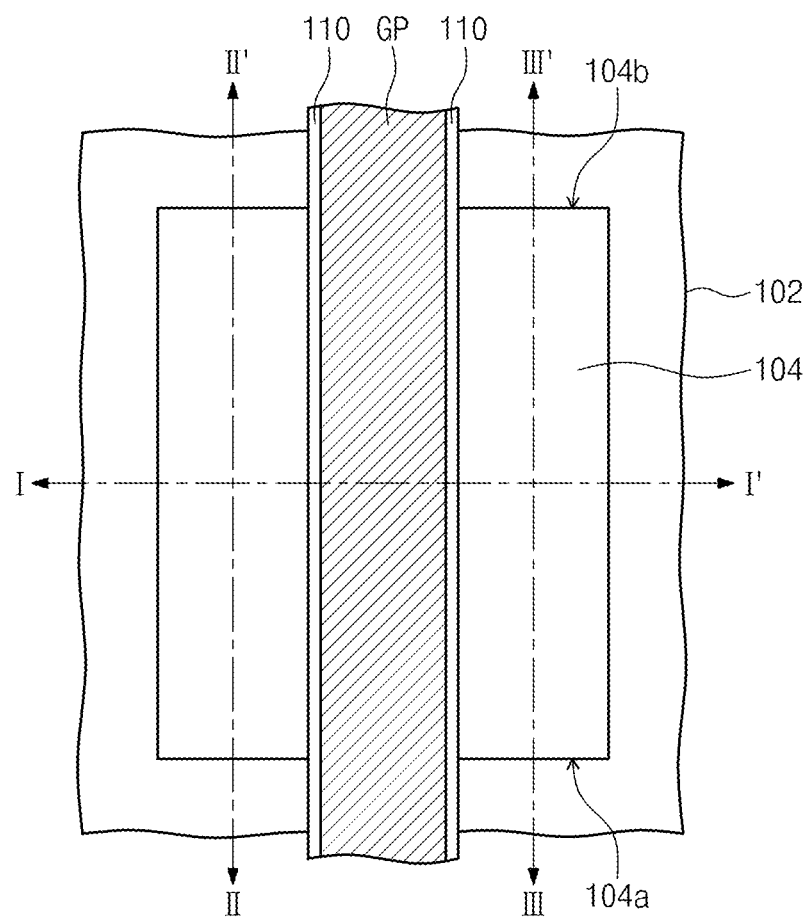
FIGS. 2A through 2D and 3A through 3D illustrate a method of fabricating a semiconductor device according to the first embodiment of the inventive concept.
Figure 2B:
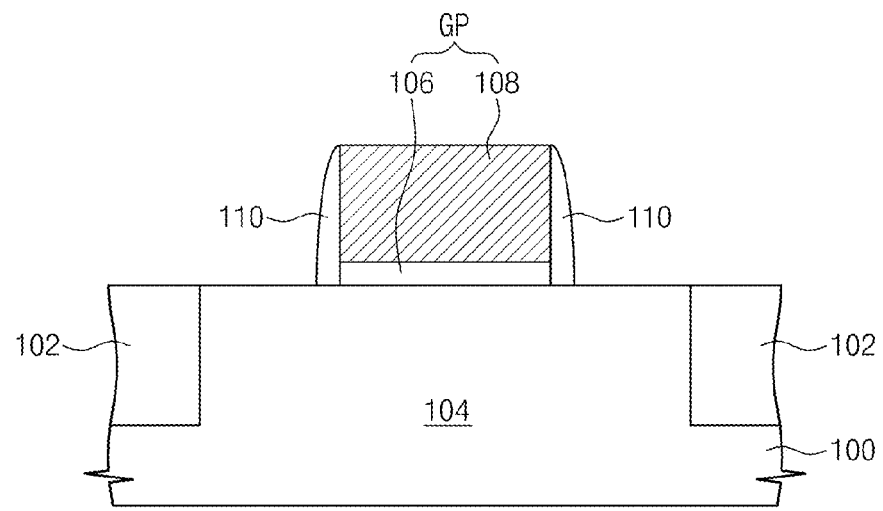
Figure 2C:
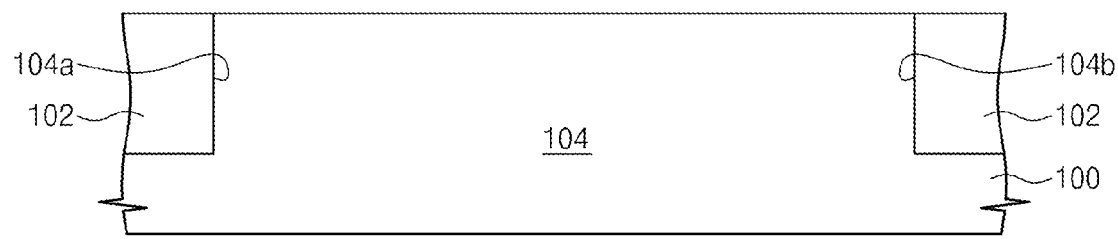
Figure 2D:
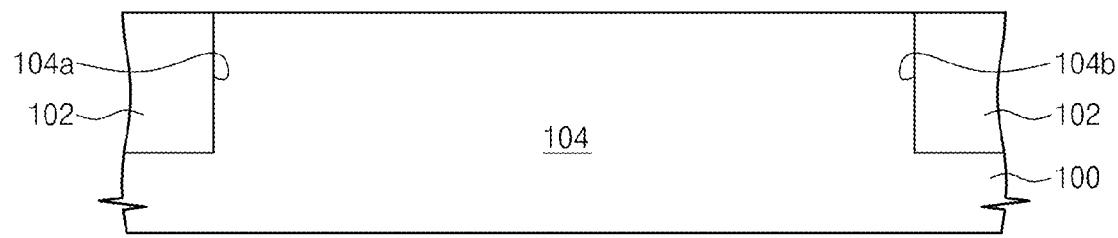
Figure 3A:
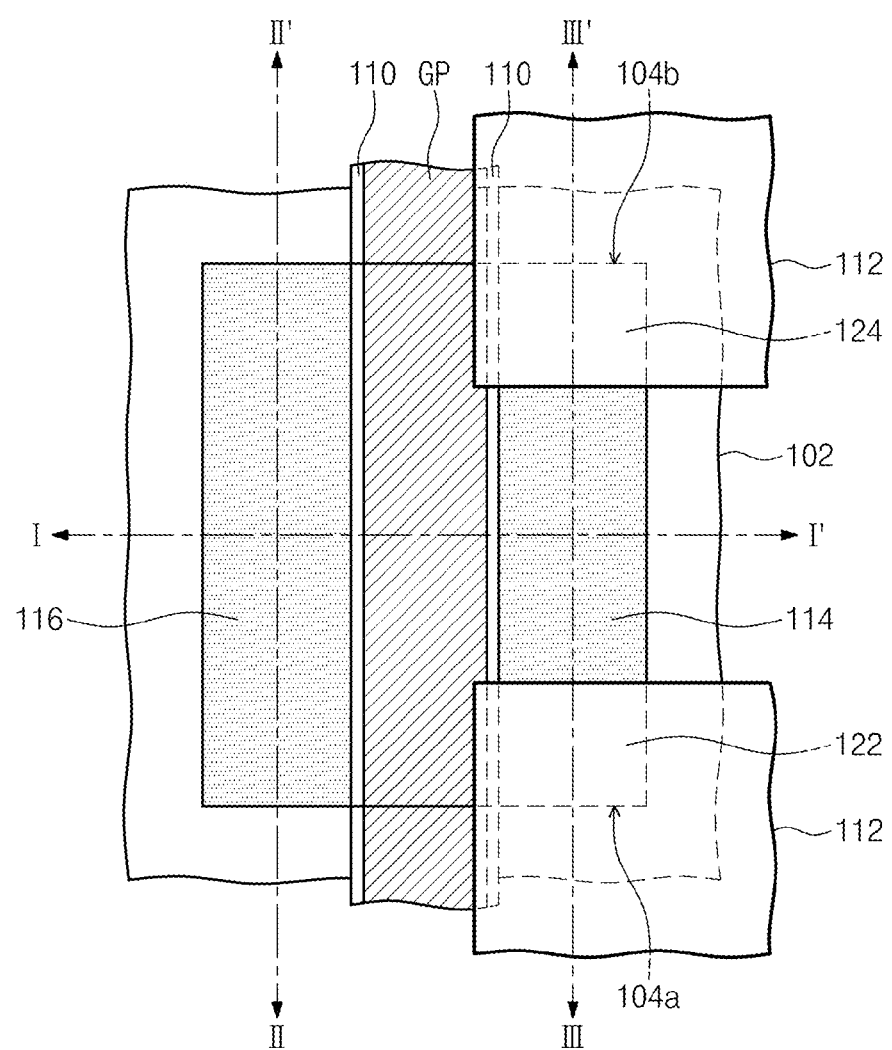
Figure 3B:
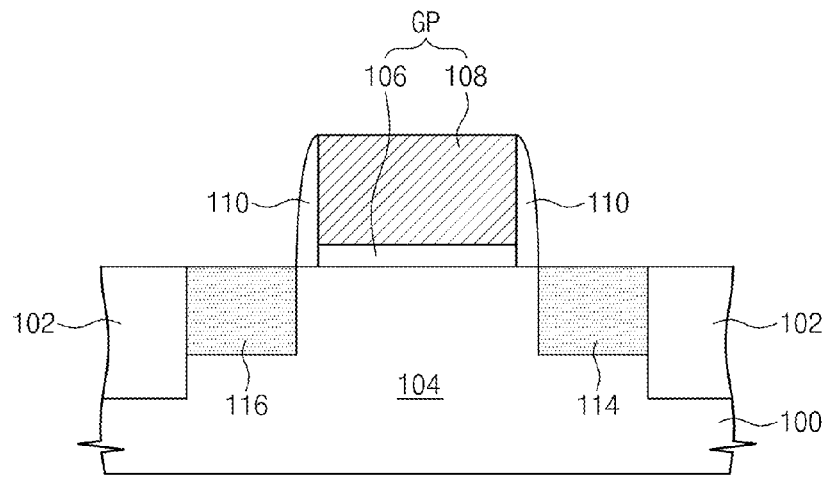
Figure 3C:
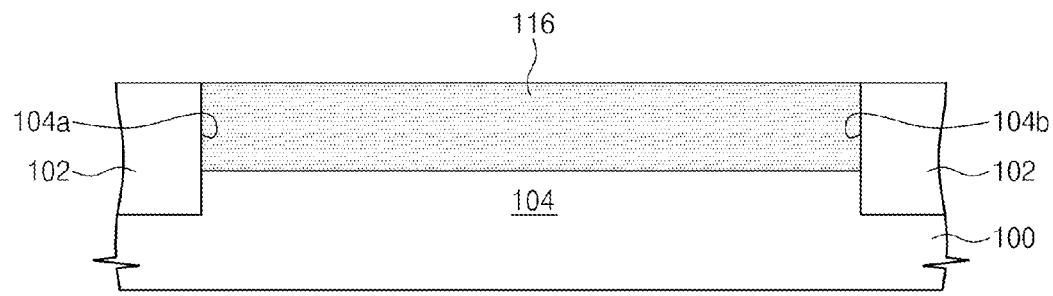
Figure 3D:
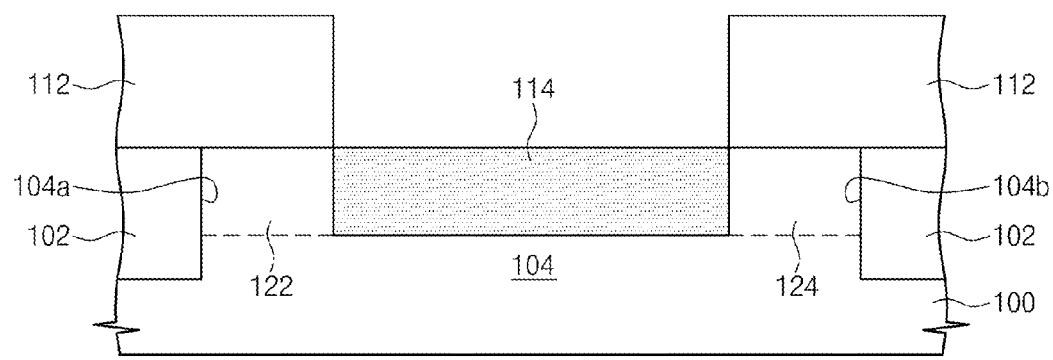

FIGS. 2A through 2D and 3A through 3D illustrate a method of fabricating a semiconductor device according to the first embodiment of the inventive concept. More specifically, FIGS. 2A through 3A are plan views illustrating a method of fabricating the semiconductor device, FIGS. 2B through 2D are sectional views taken along lines I-I', II-II', and III-III' in FIG. 2A, respectively, and FIGS. 3B through 3D are sectional views taken along lines I-I', II-II', and III-III' in FIG. 3A, respectively.

Referring to FIGS. 2A through 2D, active portion 104 is defined by forming device isolation pattern 102 on semiconductor substrate 100 doped with the dopant of the first conductive type. Active portion 104 comprises first sidewall 104a and second sidewall 104b extending in parallel in the first direction. First sidewall 104a and second sidewall 104b are boundaries where active portion 104 and device isolation pattern 102 contact each other.

Gate pattern GP is defined by sequentially stacking gate insulation layer 106 and gate electrode 108 on active portion 104. Gate pattern GP extends in the second direction perpendicular to the first direction. Gate pattern GP overlaps first sidewall 104a and second sidewall 104b.

Spacers 110 are formed on both sidewalls of gate pattern GP. Spacers 110 are formed by forming a spacer layer on semiconductor substrate 100 having gate pattern GP and then anisotropically etching the spacer layer.

Referring to FIGS. 3A through 3D, a mask pattern 112 is formed on semiconductor substrate 100 having gate pattern GP. Mask pattern 112 covers first and second portions of active portion 104 at one side of gate pattern GP adjacent to first and second sidewalls 104a and 104b. Mask pattern 112 leaves exposed a portion of active portion 104 between the first and second portions and the entire active portion 104 at the other side of gate pattern GP. Mask pattern 112 is formed of a photosensitive material.

Dopant ions of the second conductive type are implanted using mask pattern 112, gate pattern GP, and spacer 110 as an ion implantation mask. As a result, portions of active portion 104 that are not covered with mask pattern 112 are doped with a dopant of the second conduct type to form first source/drain region 114 and second source/drain region 116. First source/drain region 114 is formed by doping the exposed portion of active portion 104 at one side of gate pattern GP with the second conductive type dopant. Second source/drain region 116 is formed by doping exposed active portion 104 at the other side of gate pattern GP with the second conductive type dopant.

The first and second portions of active portion 104 covered with mask pattern 112 are not doped with the second conductive type dopant. As a result, a first barrier region 122 and a second barrier region 124 doped with the first conductive type dopant are respectively defined between first source/drain region 114 and first sidewall 104a and between first source/drain region 114 and second sidewall 104b. First source/drain region 114 is spaced from first sidewall 104a by first barrier region 122 and is spaced from second sidewall 104b by second barrier region 124. First and second barrier regions 122 and 124 are portions of active portion 104 undoped with the second conductive type dopant. A concentration of the first conductive type dopant of first and second barrier regions 122 and 124 is substantially the same as that of active portion 104.

After mask pattern 112 is removed, a metal silicide process is performed. The metal silicide process forms first silicide pattern 132 covering first source/drain region 114 and first and second barrier regions 122 and 124, second silicide pattern 134 covering the second source/drain region 116, and third silicide pattern 136 covering gate electrode 108. The metal silicide process can be one of a tungsten silicide process, a titanium silicide process, a cobalt silicide process, and a tantalum silicide process, for example.

Figure 4A:
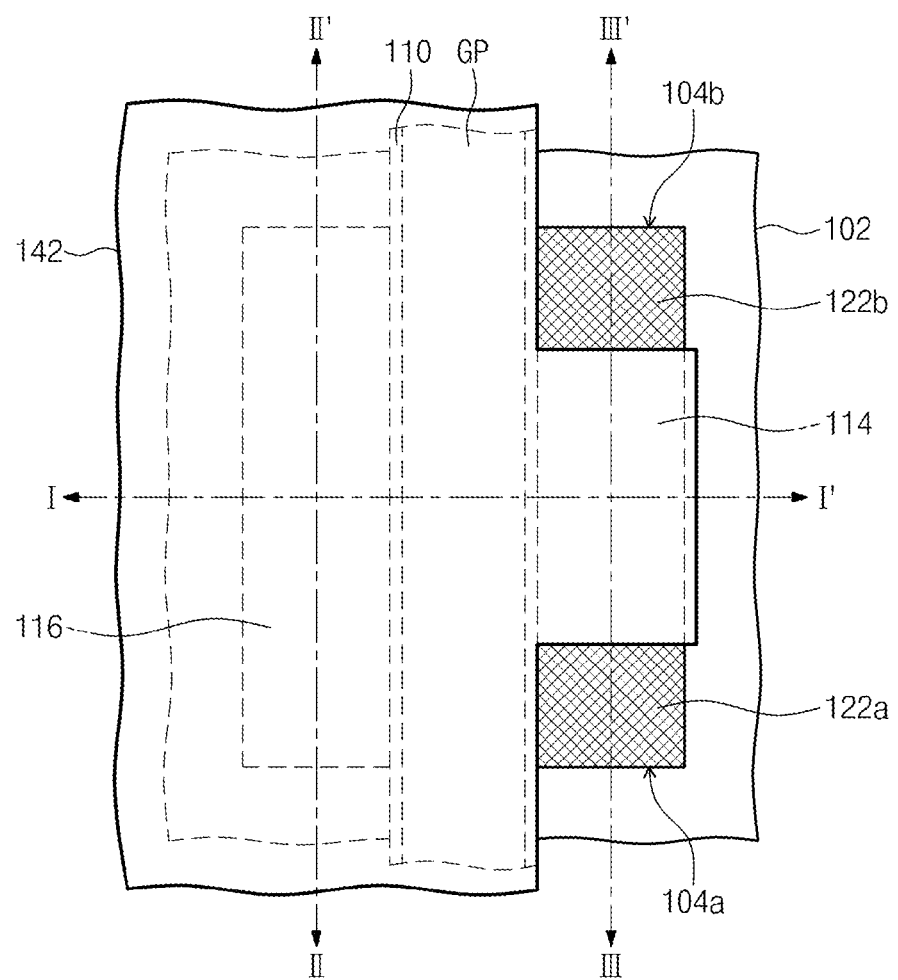
FIG. 4A through 4D are views illustrating a semiconductor device and fabrication method according to a first variation of the first embodiment.
Figure 4B:
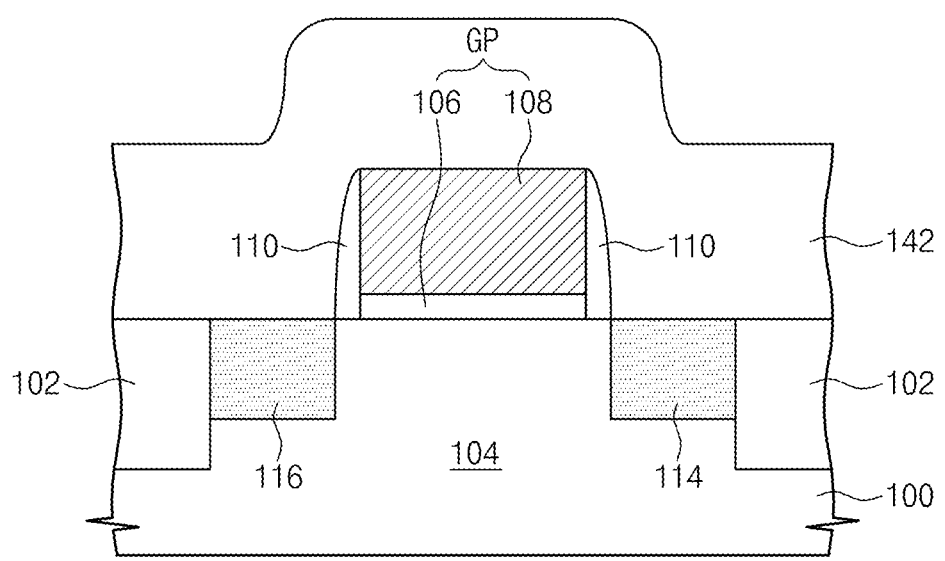
Figure 4C:
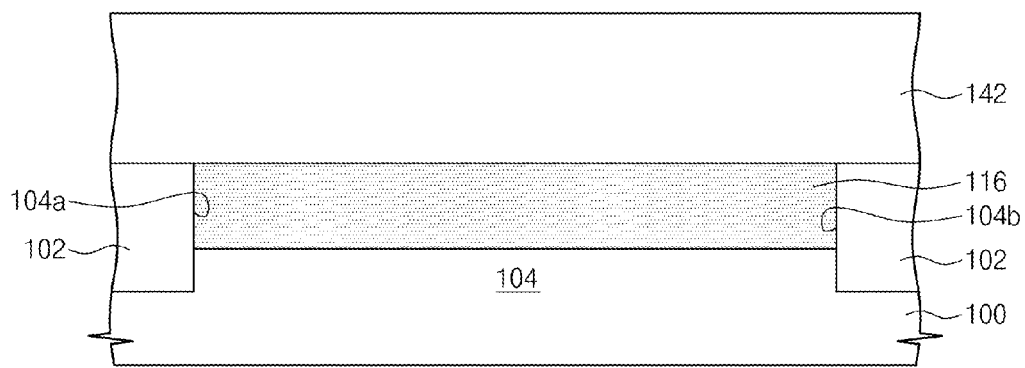
Figure 4D:
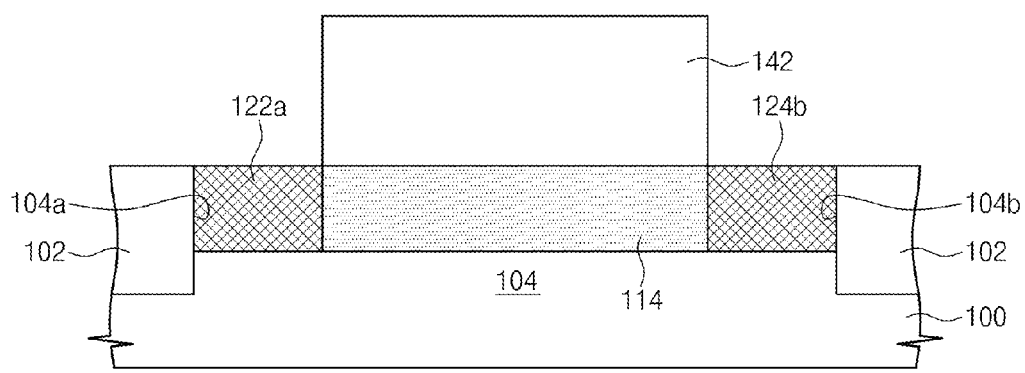

FIG. 4A through 4D are views illustrating a semiconductor device and fabrication method according to a first variation of the first embodiment. More specifically, FIG. 4A is a plan view illustrating the semiconductor device and fabrication method according to the first variation of the first embodiment, and FIGS. 4B through 4D are respective sectional views taken along lines I-I', II-II', and III-III' in FIG. 4A.

The method of FIGS. 4A through 4D begins with the semiconductor device described with reference to FIGS. 2A through 2D and FIGS. 3A through 3D. An additional mask pattern 142 is formed to cover the first and second source/drain regions 114 and 116 but not to cover first and second barrier regions 122 and 124. Additional mask pattern 142 is formed of the same material as mask pattern 112.

The first conductive type dopant is implanted on first and second barrier regions 122 and 124 using additional mask pattern 142 and gate pattern GP as an ion implantation mask. As a result, first and second barrier regions 122a and 124a are formed where the first conductive type dopant is further implanted. A concentration of the first conductive type dopant of first and second barrier regions 122a and 124a is higher than that of active portion 104.

After additional mask pattern 142 is removed, a metal silicide process is performed as described with reference to FIGS. 3A through 3D so that metal silicide patterns are formed to cover first and second source/drain regions 114 and 116, first and second barrier regions 122a and 124a, and gate electrode 108.

Figure 5A:
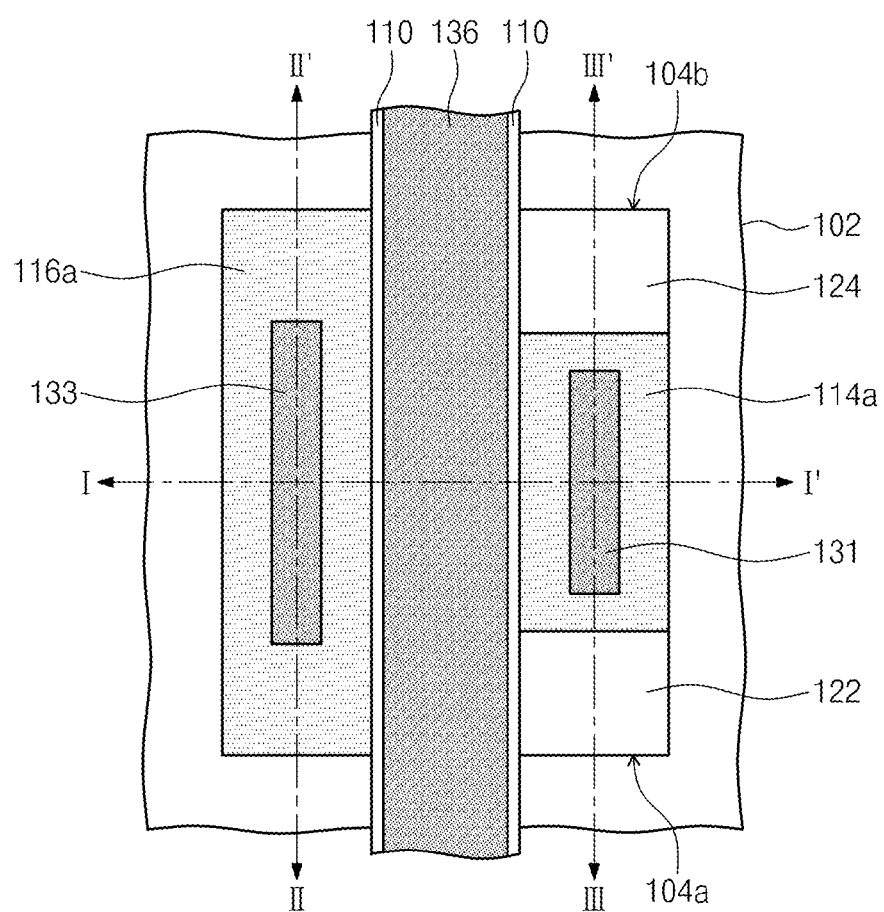
FIGS. 5A through 5D are views illustrating a semiconductor device and fabrication method according to a second variation of the first embodiment.
Figure 5B:
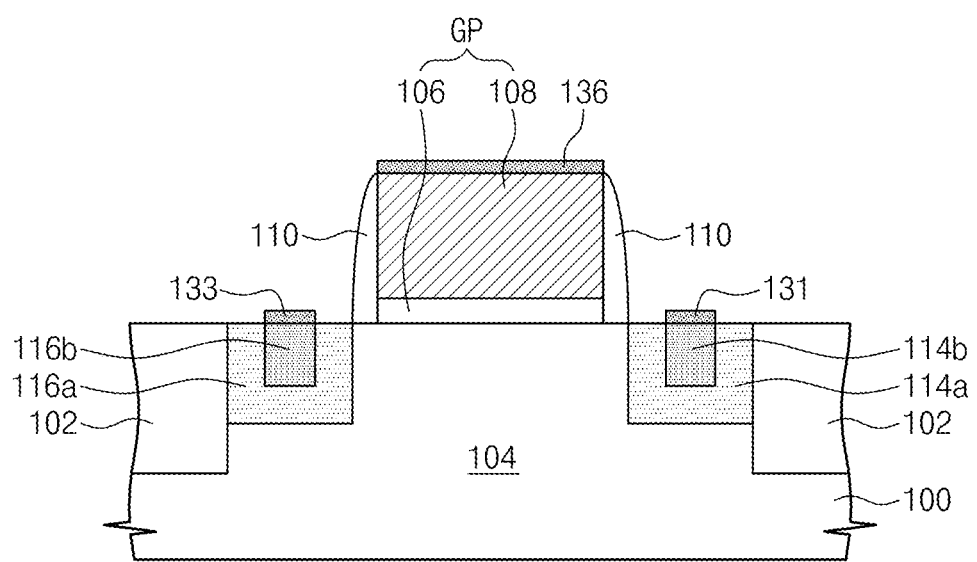
Figure 5C:
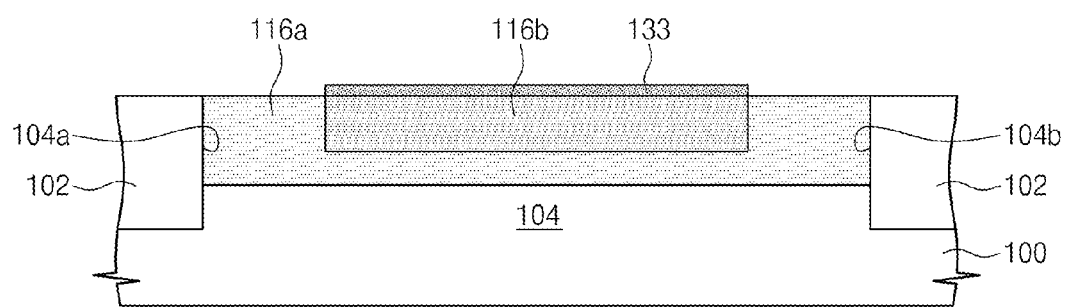
Figure 5D:
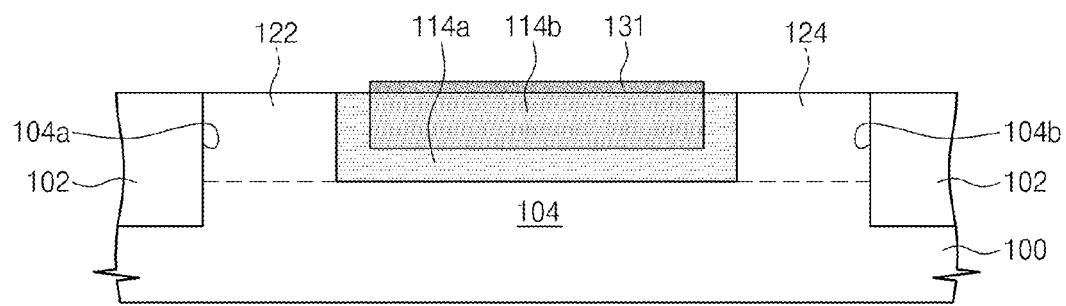

FIGS. 5A through 5D are views illustrating a semiconductor device and fabrication method according to a second variation of the first embodiment. More specifically, FIG. 5A is a plan view illustrating the semiconductor device and fabrication method according to the second variation of the first embodiment, and FIGS. 5B through 5D are sectional views taken along lines I-I', II-II', and III-III' in FIG. 5A.

The method of FIGS. 5A through 5D begins with the semiconductor device described with reference to FIGS. 2A through 2D and FIGS. 3A through 3D. A mask pattern is formed to cover the edge portions of first and second source/drain regions 114 and 116, but not the middle portions of first and second source/drain regions 114 and 116. The second conductive type dopant is further implanted on the middle portions of first and second source/drain regions 114 and 116 using the mask pattern as an ion implantation mask. This produces first source/drain regions 114a and 114b comprising a first low concentration doping region 114a and a first high concentration doping region 114b in first low concentration doping region 114a, and second source/drain regions 116a and 116b comprising a second low concentration doping region 116a and a second high concentration doping region 116b in second low concentration doping region 116a.

First and second low concentration doping regions 114a and 116a are portions of first and second source/drain regions 114 and 116 into which the second conductive type dopant is not additionally doped due to the covering of the mask pattern. Each of first and second high concentration doping regions 114b and 116b are portions of first and second source/drain regions 114 and 116 into which the second conductive type dopant is additionally doped. A concentration of the second conductive type dopant of the first and second high concentration doping regions 114b and 116b is higher than that of first and second low concentration doping regions 114a and 116a.

First through third silicide patterns 131, 133, and 136 are formed to cover first high concentration doping region 114b, second high concentration doping region 116b, and gate electrode 108, respectively. First silicide pattern 131 covers first high concentration doping region 114b and does not cover first low concentration doping region 114a and first and second barrier regions 122 and 124. Second silicide pattern 133 covers second high concentration doping region 116b and does not cover second low concentration doping region 116a. First through third silicide patterns 131, 133, and 136 are formed by creating a blocking mask pattern and then performing a metal silicide process using the blocking mask pattern as a mask. The blocking mask pattern covers the first and second low concentration doping regions 114a and 116a and first and second barrier regions 122 and 124 and does not cover gate electrode 108 and the first and second high concentration doping regions 114b and 116b.

Figure 6A:
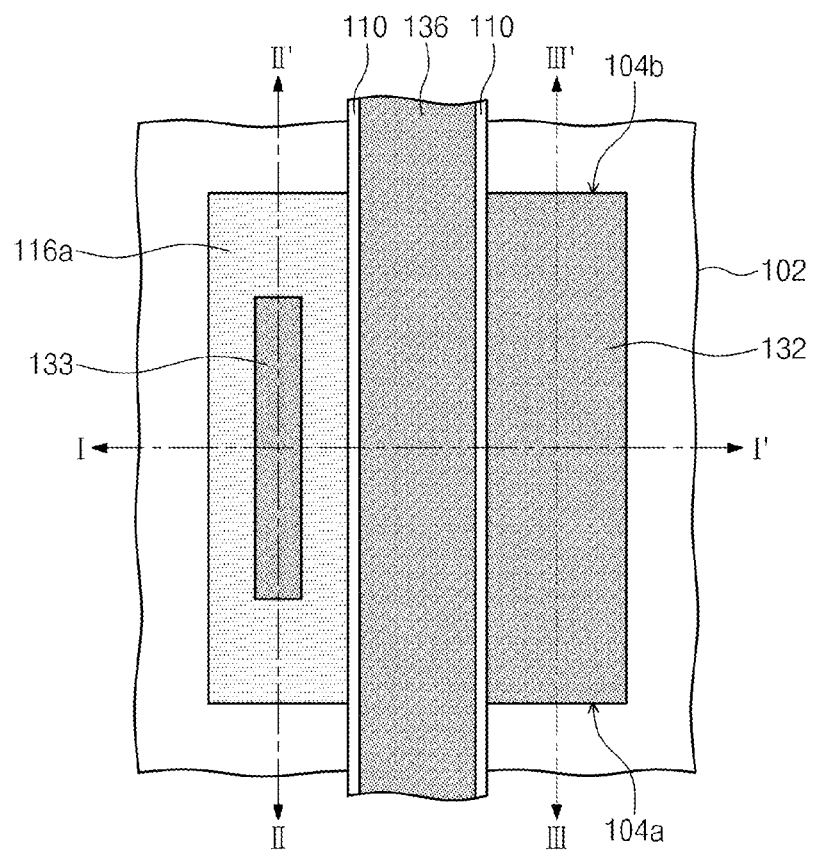
FIGS. 6A through 6D are views illustrating a semiconductor device and fabrication method according to a third variation of the first embodiment.
Figure 6B:
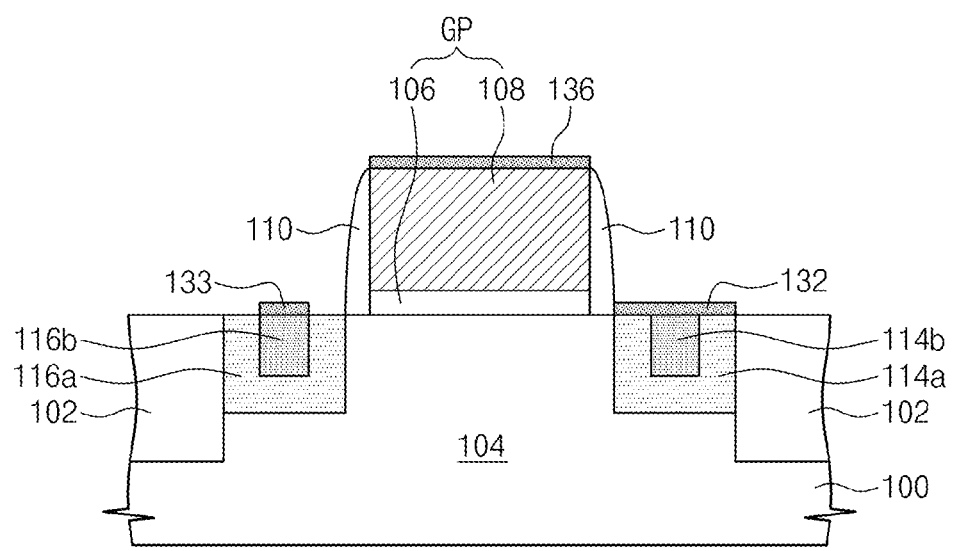
Figure 6C:
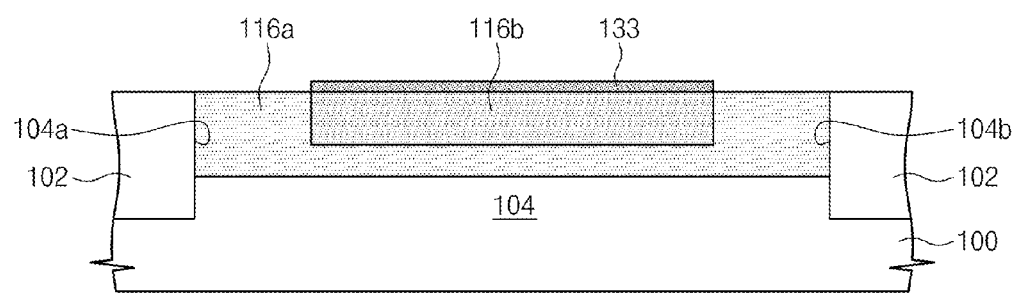
Figure 6D:
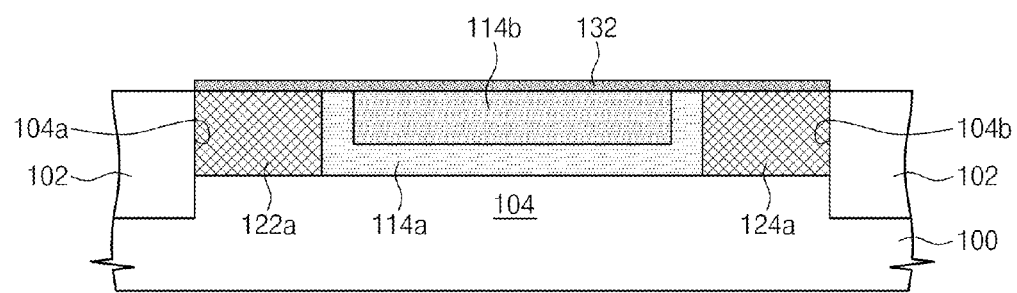

FIGS. 6A through 6D are views illustrating a semiconductor device and fabrication method according to a third variation of the first embodiment. More specifically, FIG. 6A is a plan view illustrating the semiconductor device and fabrication method according to the third variation of the first embodiment, and FIGS. 6B through 6D are sectional views taken along lines I-I', II-II', and III-III' in FIG. 6A.

Referring to FIGS. 6A through 6D, the method begins with the semiconductor device described with reference to FIGS. 2A through 2D and FIGS. 3A through 3D. First source/drain region 114a and 114b (including first low concentration doping region 114a and first high concentration doping region 114b), and second source/drain regions 116a and 116b (including second low concentration doping region 116a and second high concentration doping region 116b) are formed.

A mask pattern is formed to cover first source/drain regions 114a and 114b and second source/drain regions 116a and 116b, but no first and second barrier regions 122 and 124. An implantation process of the first conductive type dopant is performed using the mask pattern and gate pattern GP as an ion implantation mask. This forms first and second barrier regions 122a and 124a into which the first conductive type dopant is further implanted. A concentration of the first conductive type dopant of first and second barrier regions 122a and 124a is higher than that of active portion 104.

Next, the method forms first silicide pattern 132 covering first source/drain regions 114a and 114b and first and second barrier regions 122a and 124a, a second silicide pattern 134 covering second high concentration doping region 116b and not covering second low concentration doping region 116a, and a third silicide pattern 136 covering gate electrode 108. First through third silicide patterns 132, 133, and 136 are formed by forming a blocking mask pattern and performing a metal silicide process by using the blocking mask pattern as a mask. In this case, the blocking mask pattern can be formed to cover second low concentration doping region 116a and to expose gate electrode 108, second high concentration doping region 116b, and first source/drain regions 114a and 114b.

Figure 7:
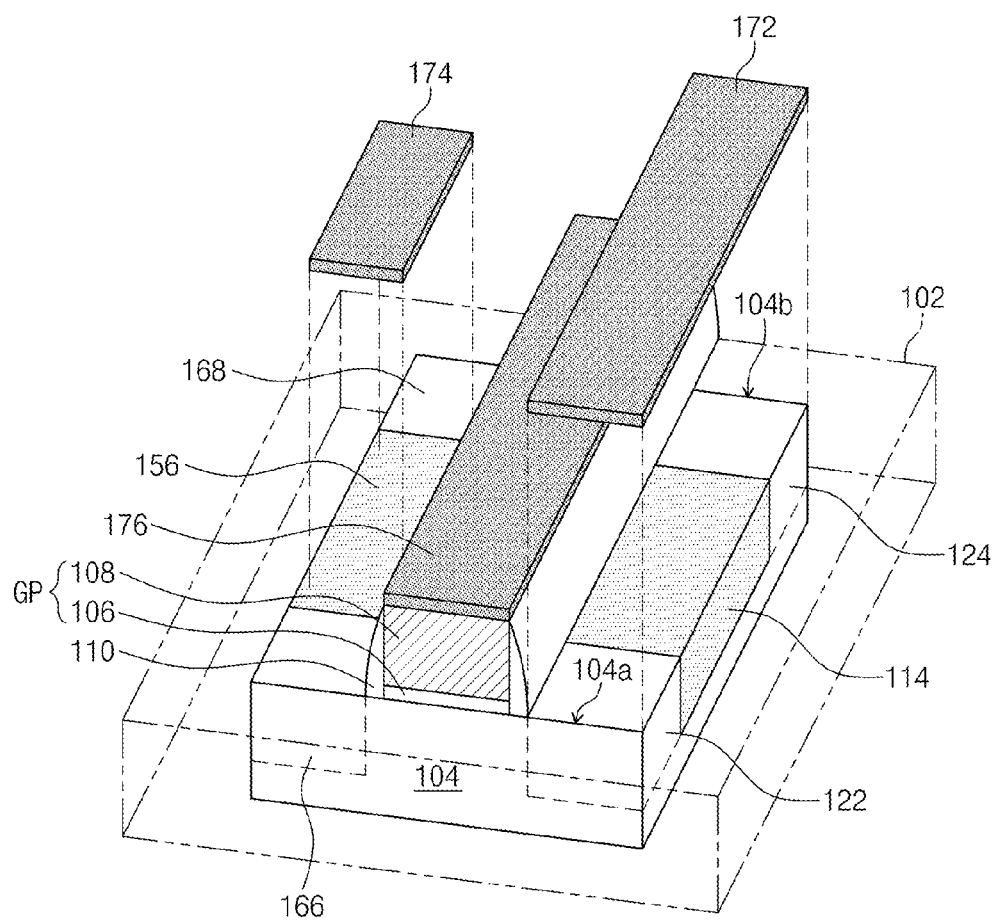
FIG. 7 is a perspective view illustrating a semiconductor device according to a second embodiment of the inventive concept.

FIG. 7 is a perspective view illustrating a semiconductor device according to a second embodiment of the inventive concept.

Referring to FIG. 7, the semiconductor device comprises semiconductor substrate 100, device isolation pattern 102, active portion 104, first sidewall 104a, second sidewall 104b, gate pattern GP, and spacers 110. First source/drain region 114, first barrier region 122, and second barrier region 124 are disposed in active portion 104 at one side of gate pattern GP.

A second source/drain region 156, a third barrier region 166, and a fourth barrier region 168 are disposed in active portion 104 at the other side of gate pattern GP. Third barrier region 166 is disposed between second source/drain region 156 and first sidewall 104a, and fourth barrier region 168 is disposed between second source/drain region 156 and second sidewall 104b. Second source/drain region 156 is spaced from first sidewall 104a and second side wall 104b. Third barrier region 166, second source/drain region 156, and fourth barrier region 168 are sequentially disposed from first sidewall 104a. Third and fourth barrier regions 166 and 168 contact first and second sidewalls 104a and 104b, respectively. Third and fourth barrier regions 166 and 168 contact device isolation pattern 102.

Second source/drain region 156 is doped with the second conductive type dopant and third barrier region 166 and fourth barrier region 168 are doped with the first conductive type dopant. Third barrier region 166 is formed of portions of active portion 104 disposed between second source/drain region 156 and first sidewall 104a. Fourth barrier region 168 is formed of portions of active portion 104 disposed between the second source/drain region 156 and second sidewall 104b. Accordingly, a concentration of the first conductive type dopant of third and fourth barrier regions 166 and 168 is substantially the same as that of semiconductor substrate 100.

A first silicide pattern 172 covers first source/drain region 114 and first and second barrier regions 122 and 124. A second silicide pattern 174 covers second source/drain region 156 and does not cover third and fourth barrier regions 166 and 168. Second silicide pattern 174 and third and fourth barrier regions 166 and 168 are insulated from each other. A third silicide pattern 176 covers gate electrode 108. First through third silicide patterns 172, 174, and 176 comprise a metal silicide. The metal silicide is one of tungsten silicide, titanium silicide, cobalt silicide, and tantalum silicide.

Figure 8A:
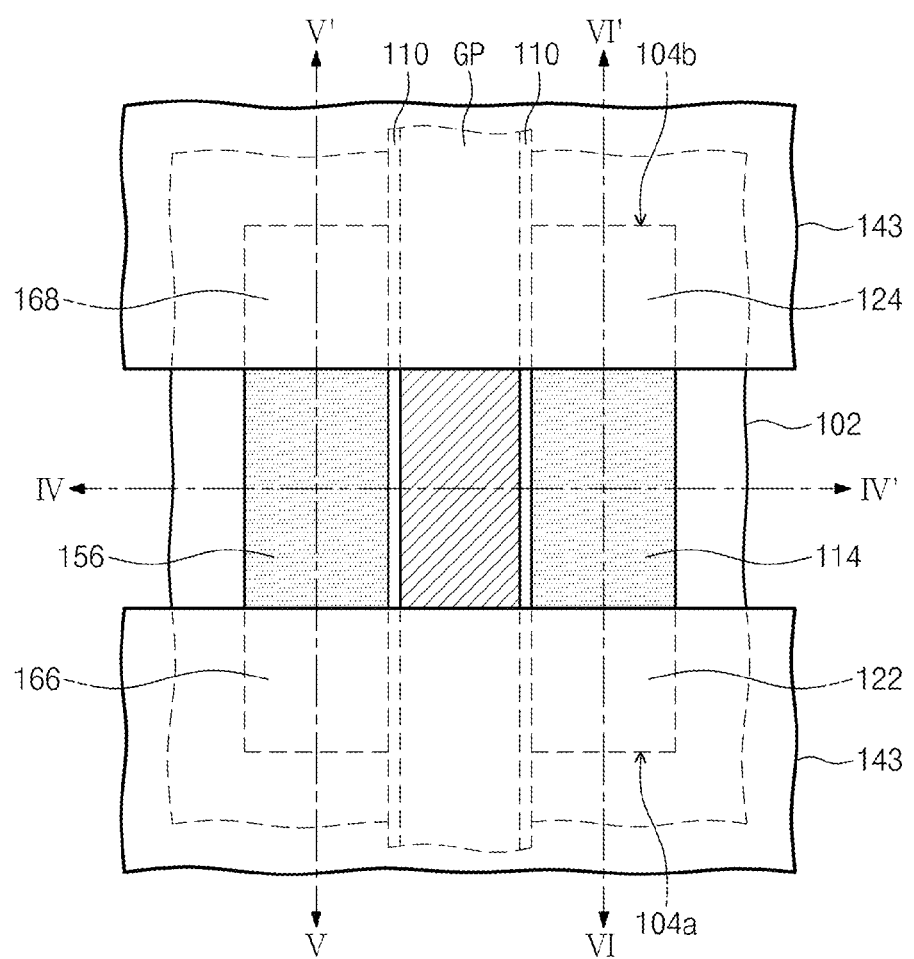
FIGS. 8A through 8D illustrate a method of fabricating a semiconductor device according to the second embodiment of the inventive concept.
Figure 8B:
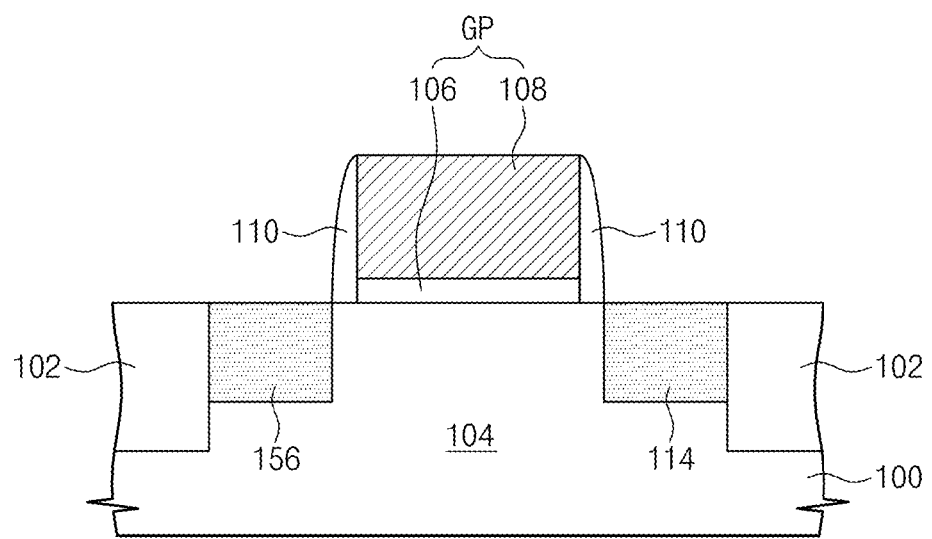
Figure 8C:
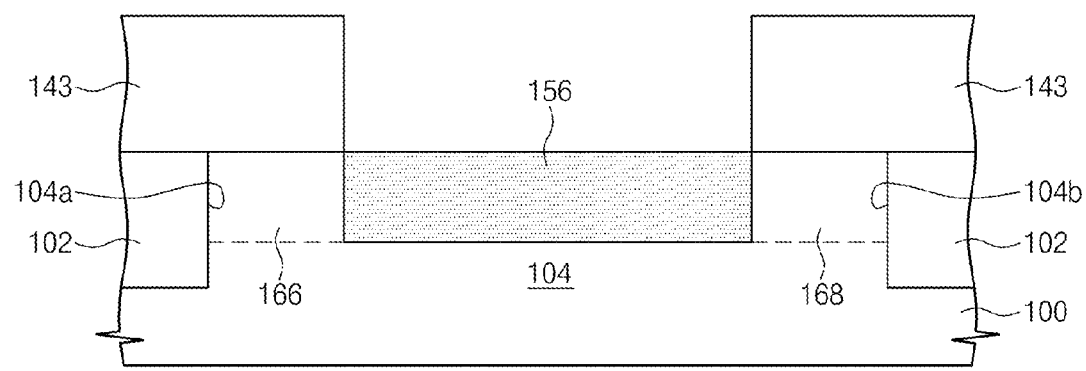
Figure 8D:
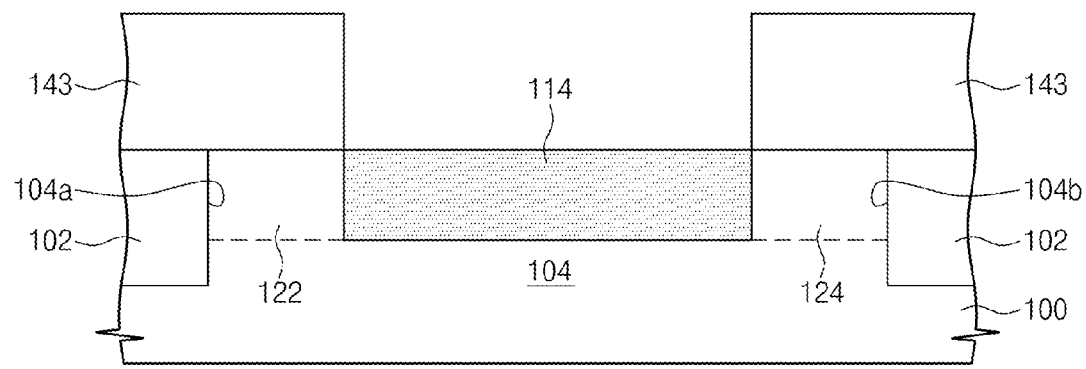

FIGS. 8A through 8D illustrate a method of fabricating a semiconductor device according to the second embodiment of the inventive concept. More specifically, FIG. 8A is a plan view illustrating the method of fabricating the semiconductor device according to the second embodiment of the inventive concept, and FIGS. 8B through 8D are sectional views taken along lines IV-IV', V-V', and VI-VI' in FIG. 8A, respectively.

The method of FIGS. 8A through 8D begins with the semiconductor device described with reference to FIGS. 2A through 2D. A mask pattern 143 is formed on a semiconductor substrate 100 having gate pattern GP. Mask pattern 143 covers first and second portions of active portion 104 disposed at one side of gate pattern GP and adjacent to first and second sidewalls 104a and 104b. Mask pattern 143 covers third and fourth portions of active portion 104 disposed at the other side of gate pattern GP and adjacent to first and second sidewalls 104a and 104b. Mask pattern 143 does not cover portions of active portion 104 between the first and second portions and portions of active portion 104 between the third and fourth portions.

Second conductive type dopant ions are implanted using mask pattern 143 and gate pattern GP as an ion implantation mask. As a result, portions of active portion 104 that are not covered by mask pattern 143 and gate pattern GP are doped with the second conductive type dopant to form first and second source/drain regions 114 and 156. First source/drain region 114 is formed by doping a portion of active portion 104 at one side of gate pattern GP with the second conductive type dopant, and second source/drain region 156 is formed by doping a portion of active portion 104 at the other side of gate pattern GP with the second conductive type dopant.

The first through fourth portions of active portion 104 covered with mask pattern 143 are not be doped with the second conductive type dopant. Therefore, first barrier region 122 and second barrier region 124 doped with the first conductive type dopant are respectively defined between first source/drain region 114 and first sidewall 104a and between first source/drain region 114 and second sidewall 104b. A third barrier region 166 and a fourth barrier region 168 doped with the first conductive type dopant are respectively defined between second source/drain region 156 and first sidewall 104a and between second source/drain region 156 and second sidewall 104b. First through fourth barrier regions 122, 123, 166, and 168 are portions of active portion 104 undoped with the second conductive type dopant. First and third barrier regions 122 and 166 contact first sidewall 104a and second and fourth barrier regions 124 and 168 contact second sidewall 104. A concentration of the first conductive type dopant of first through fourth barrier regions 122, 124, 166, and 168 is substantially the same as that of semiconductor substrate 100.

Next, the method forms first silicide pattern 172 covering first source/drain region 114 and first and second barrier regions 122 and 124, second silicide pattern 174 covering second source/drain region 156 and not covering third and fourth barrier regions 166 and 168, and third silicide pattern 176 covering gate electrode 108. For example, first through third silicide patterns 172, 174, and 176 can be formed by forming a blocking mask pattern and performing a metal silicide process using the blocking mask pattern as a mask. In this case, the blocking mask pattern can be formed to expose first source/drain region 114, first and second barrier regions 122 and 124, and second source/drain region 156 and to cover third and fourth barrier regions 166 and 168. In this case, first source/drain region 114 can serve as a source and second source/drain region 156 can serve as a drain.

Figure 9A:
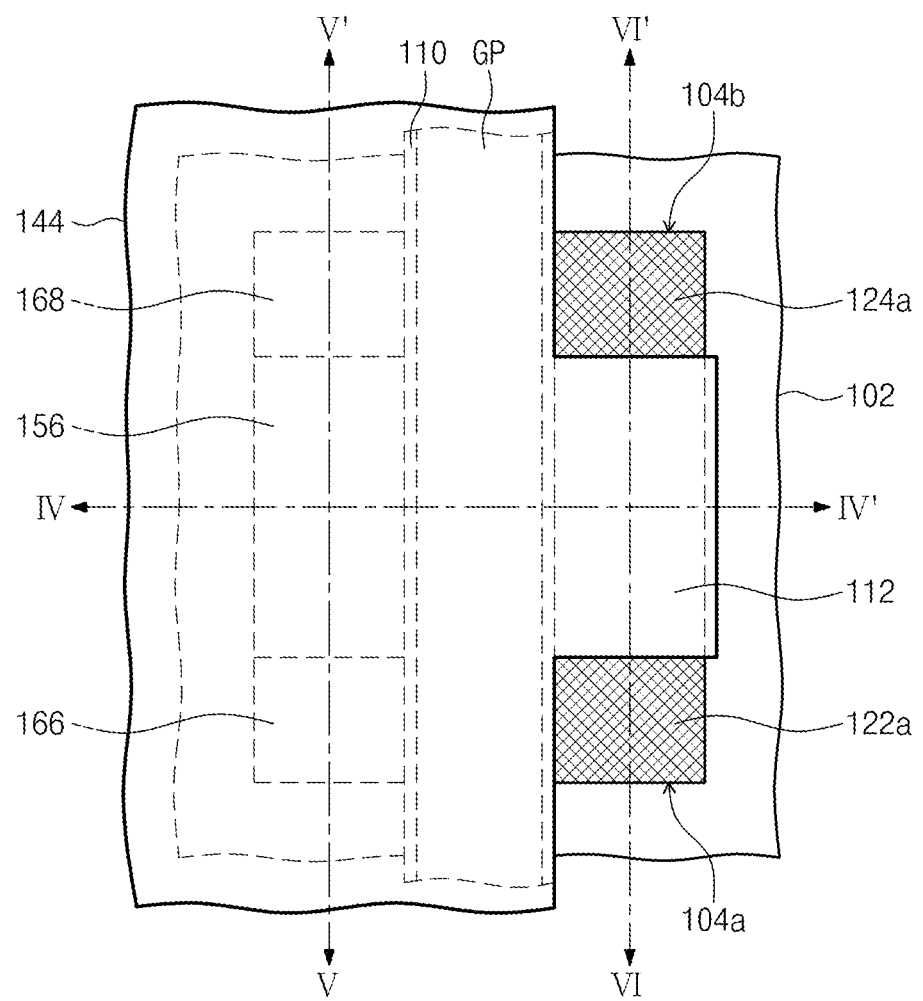
FIGS. 9A through 9D are views illustrating a semiconductor device and fabrication method according to a first variation of the second embodiment.
Figure 9B:
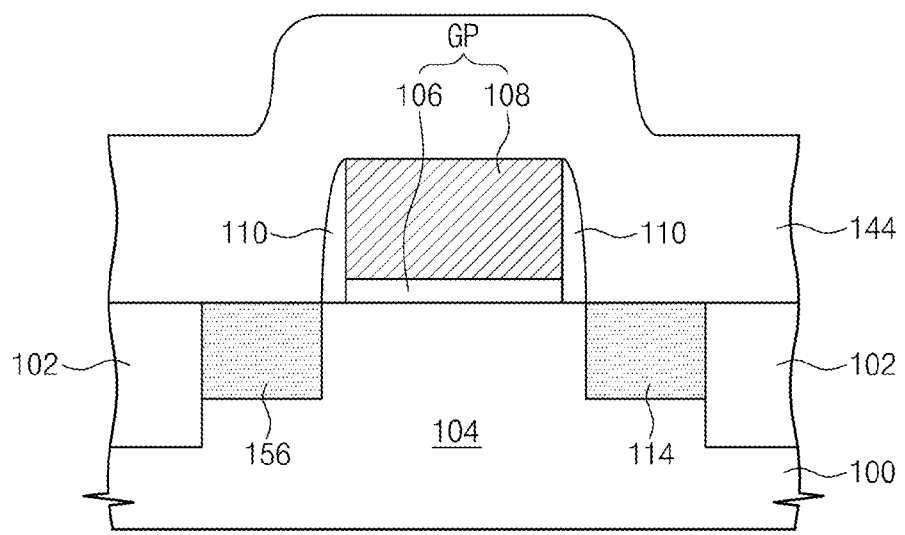
Figure 9C:
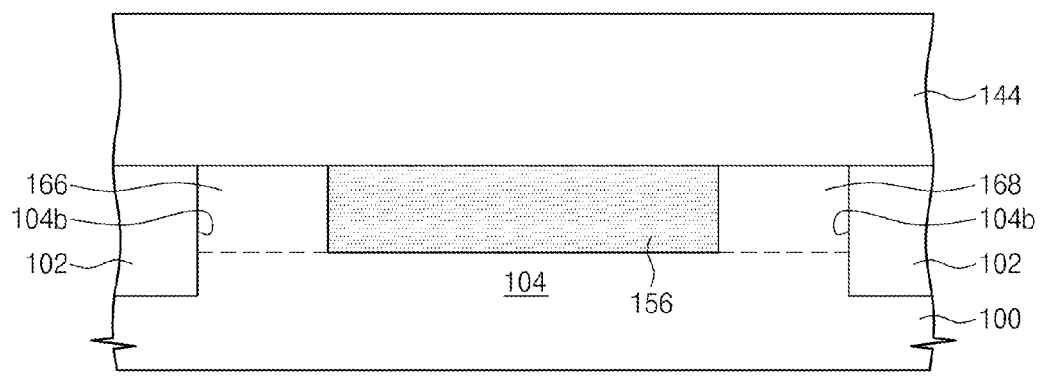
Figure 9D:
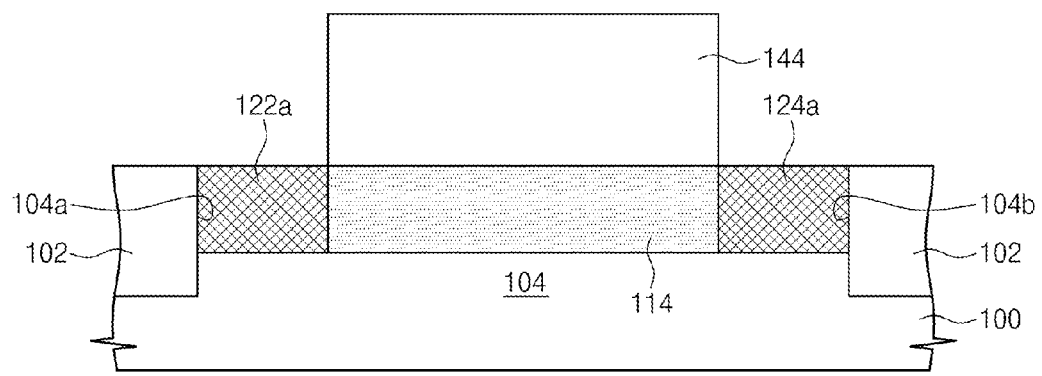

FIGS. 9A through 9D are views illustrating a semiconductor device and fabrication method according to a first variation of the second embodiment of the inventive concept. More specifically, FIG. 9A is a plan view illustrating a semiconductor device and fabrication method according to the first variation of the second embodiment, and FIGS. 9B through 9D are respective sectional views taken along lines IV-IV', V-V', and VI-VI' in FIG. 9A.

The method of FIGS. 9A through 9D begins with the semiconductor device described with reference to FIGS. 2A through 2D and FIGS. 8A through 8D. Mask pattern 144 is formed to leave exposed first and second barrier regions 122 and 124 and to cover first and second source/drain regions 114 and 116 and third and fourth barrier regions 166 and 168.

First conductive type dopant ions are implanted on first and second barrier regions 122 and 124 using additional mask pattern 144 and gate pattern GP as an ion implantation mask. This forms first and second barrier regions 122a and 124a into which the first conductive type dopant is further implanted. A concentration of the first conductive type dopant of first and second barrier regions 122a and 124a is higher than that of active portion 104.

Next, the method forms a first silicide pattern covering first source/drain region 114 and first and second barrier regions 122a and 124a, a second silicide pattern covering second source/drain region 156 and not covering third and fourth barrier regions 166 and 168, and a third silicide pattern covering gate electrode 108. For example, the first through third silicide patterns can be formed by forming a blocking mask pattern and performing a metal silicide process using the blocking mask pattern as a mask. In this case, the blocking mask pattern can be formed to expose gate electrode 108, first source/drain region 114, first and second barrier regions 122a and 124a, and second source/drain region 156 and to cover third and fourth barrier regions 166 and 168.

Figure 10A:
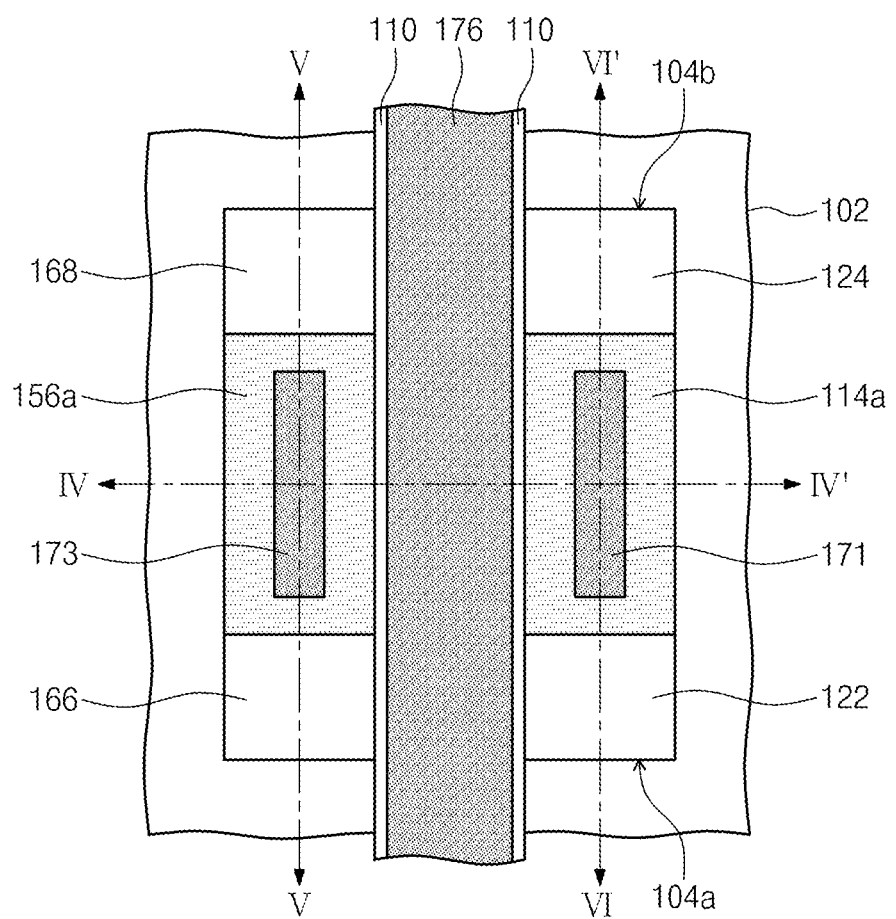
FIG. 10A through 10D are views illustrating a semiconductor device and fabrication method according to a second variation of the second embodiment.
Figure 10B:
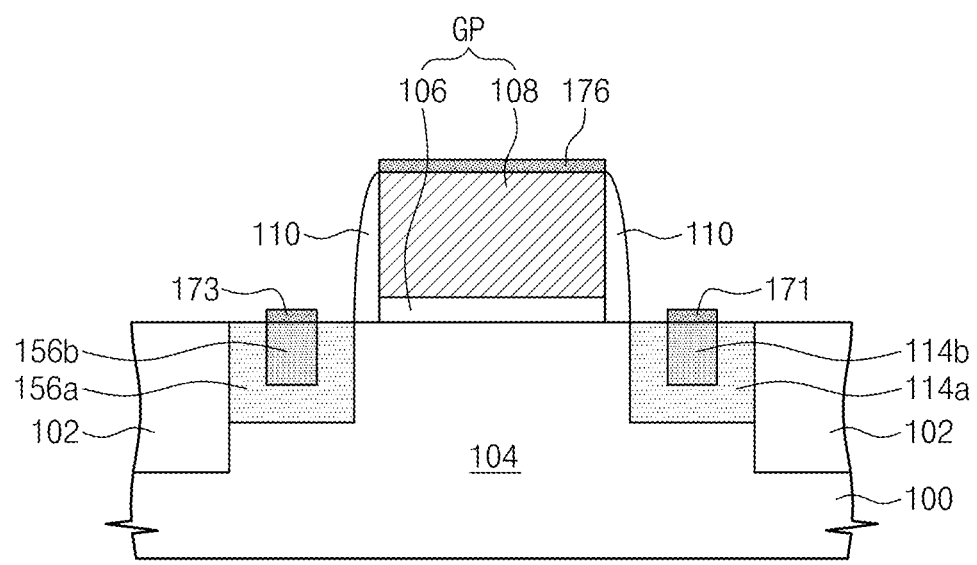
Figure 10C:
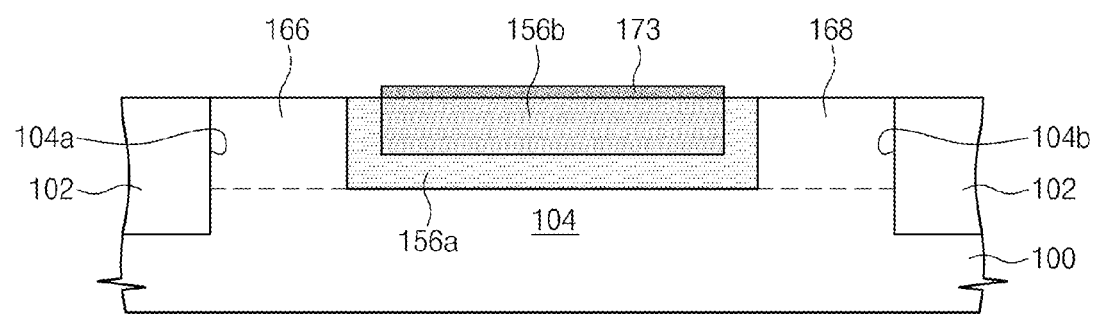
Figure 10D:
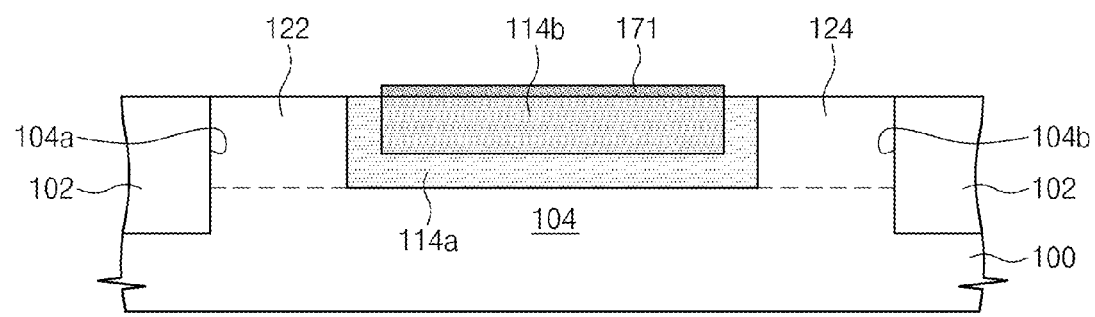

FIG. 10A through 10D are views illustrating a semiconductor device and fabrication method according to a second variation of the second embodiment of the inventive concept. More specifically, FIG. 10A is a plan view illustrating a semiconductor device and fabrication method according to the second variation of the second embodiment, and FIGS. 10B through 10D are respective sectional views taken along lines IV-IV', V-V', and VI-VI' in FIG. 10A.

The method of FIGS. 10A through 10D begins with the semiconductor device described with reference to FIGS. 2A through 2D and FIGS. 8A through 8D. A mask pattern is formed to expose the middle portions of first and second source/drain regions 114 and 156 while covering the edge portions thereof. Then, the second conductive type dopant is further implanted in the middle portions of first and second source/drain regions 114 and 156 using the mask pattern as an ion implantation mask. This forms first source/drain regions 114a and 114b comprising a first low concentration doping region 114a and a first high concentration doping region 114b in first low concentration doping region 114a, and it also forms second source/drain regions 156a and 156b comprising a second low concentration doping region 156a and a second high concentration doping region 156b in second low concentration doping region 156a.

First and second low concentration doping regions 114a and 156a are portions of first and second source/drain regions 114 and 156 that are undoped with the second conductive type dopant being covered with the mask pattern. Each of the first and second high concentration doping regions 114b and 156b are portions of first and second source/drain regions 114 and 156 that are further doped with the second conductive type dopant.

First through third silicide patterns 171, 173, and 176 are formed to cover first high concentration doping region 114b, second high concentration doping region 156b, and gate electrode 108, respectively. First silicide pattern 171 does not cover first low concentration doping region 114a and first and second barrier regions 122, and 124. Second silicide pattern 133 does not cover second low concentration doping region 116a and third and fourth barrier regions 166 and 168.

First through third silicide patterns 171, 173, and 176 are formed through a metal silicide process. For example, first through third silicide patterns 171, 173, and 176 can be formed through a metal silicide process using a blocking mask pattern as a mask. The blocking mask pattern can be formed to cover first through fourth barrier regions 122, 124, 166, and 168 and first and second low concentration doping regions 114a and 116a and to expose gate electrode 108 and first and second high concentration doping regions 114b and 116b.

Figure 11A:
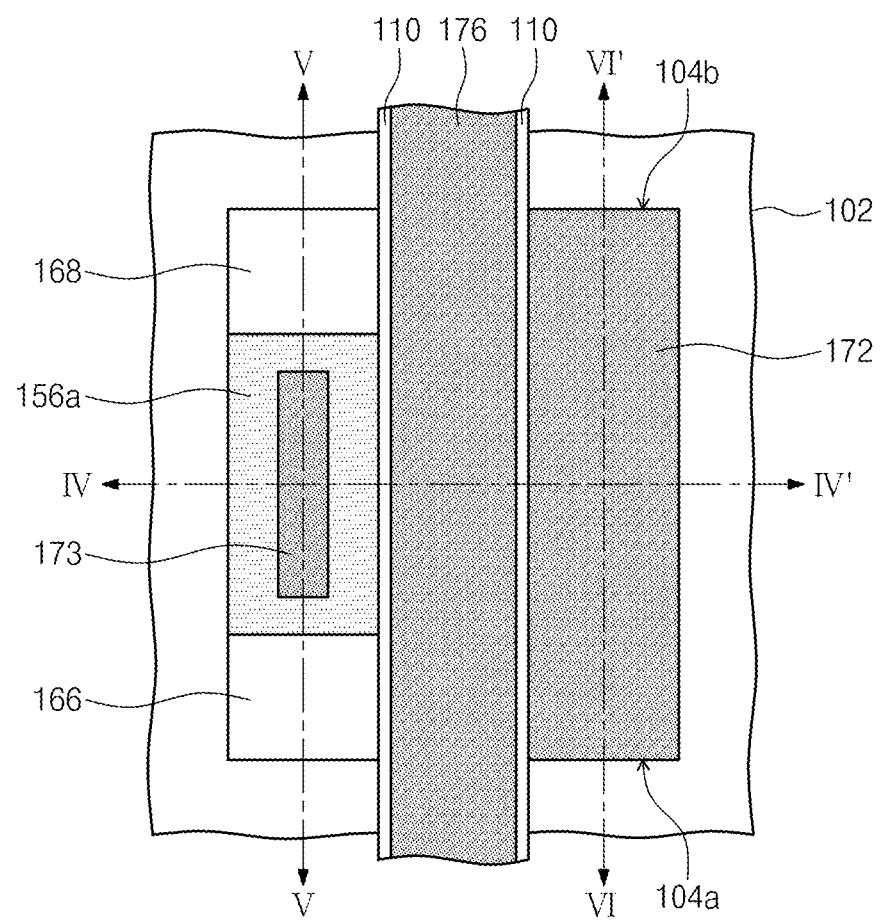
FIG. 11A through 11D are views illustrating a semiconductor device and fabrication method according to a third variation of the second embodiment.
Figure 11B:
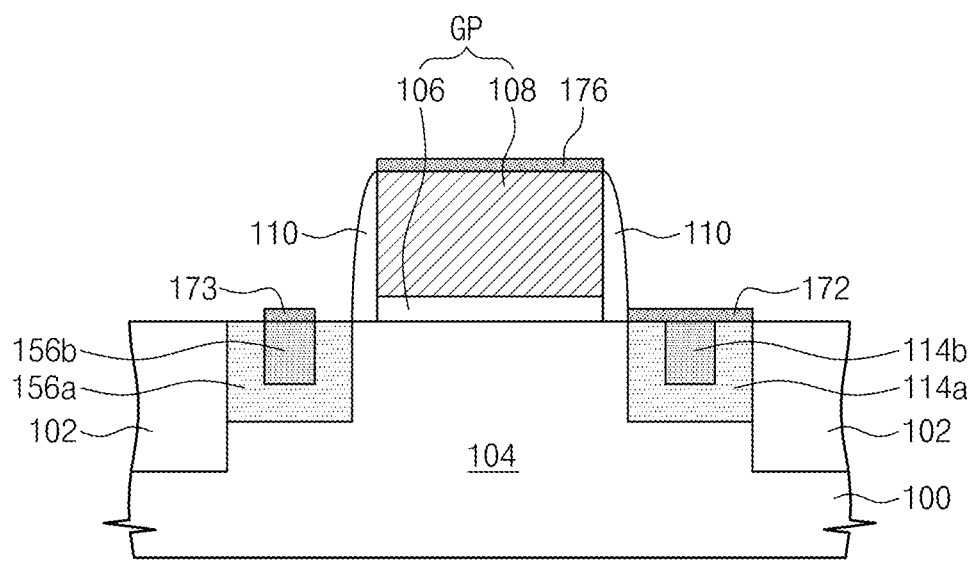
Figure 11C:
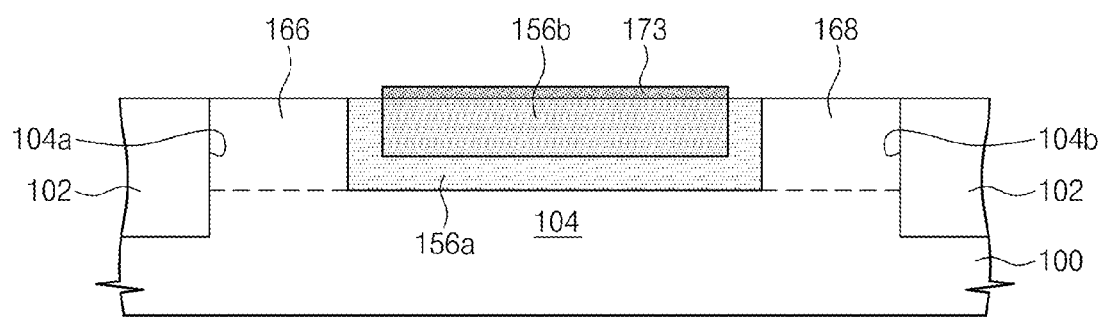
Figure 11D:
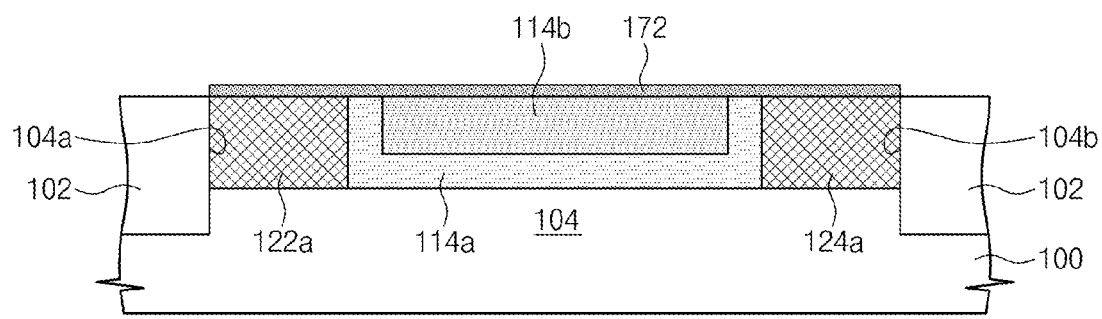

FIG. 11A through 11D are views illustrating a semiconductor device and fabrication method according to a third variation of the second embodiment of the inventive concept. More specifically, FIG. 11A is a plan view illustrating a semiconductor device and fabrication method according to the third variation of the second embodiment, and FIGS. 11B through 11D are respective sectional views taken along lines I-I', II-II', and III-III' in FIG. 11A.

The method of FIGS. 11A through 11D begins with the semiconductor device described with reference to FIGS. 2A through 2D and FIGS. 8A through 8D. The method forms first source/drain region 114a and 114b (including first low concentration doping region 114a and first high concentration doping region 114b) and second source/drain regions 156a and 156b (including second low concentration doping region 156a and second high concentration region 156b).

A mask pattern is formed to leave exposed first and second barrier regions 122 and 124 while covering first source/drain regions 114a and 114b, second source/drain regions 156a and 156b, and third and fourth barrier regions 166 and 168. An implantation process of the first conductive type dopant is performed using the mask pattern as an ion implantation mask. This forms first and second barrier regions 122a and 124a where the first conductive type dopant is further implanted. A concentration of the first conductive type dopant of first and second barrier regions 122a and 124a is higher than that of active portion 104. A concentration of the first conductive type dopant of first and second barrier regions 122a and 124a is higher than that of third and fourth barrier regions 166 and 168.

Next, the method forms first silicide pattern 172 covering first source/drain regions 114a and 114b and first and second barrier regions 122a and 124a, second silicide pattern 173 covering second high concentration doping region 156b and not covering second low concentration doping region 156a, and third silicide pattern 176 covering gate electrode 108. First through third silicide patterns 172, 173, and 176 are formed through a metal silicide process. For example, first through third silicide patterns 172, 173, and 176 can be formed by performing a metal silicide process using a blocking mask pattern as a mask. In this case, the blocking mask pattern is formed to cover second low concentration doping region 116a and third and fourth barrier regions 166 and 168 and to expose gate electrode 108, second high concentration doping region 156b, first source/drain regions 114a and 114b, and first and second barrier regions 122a and 124a.

Figure 12:
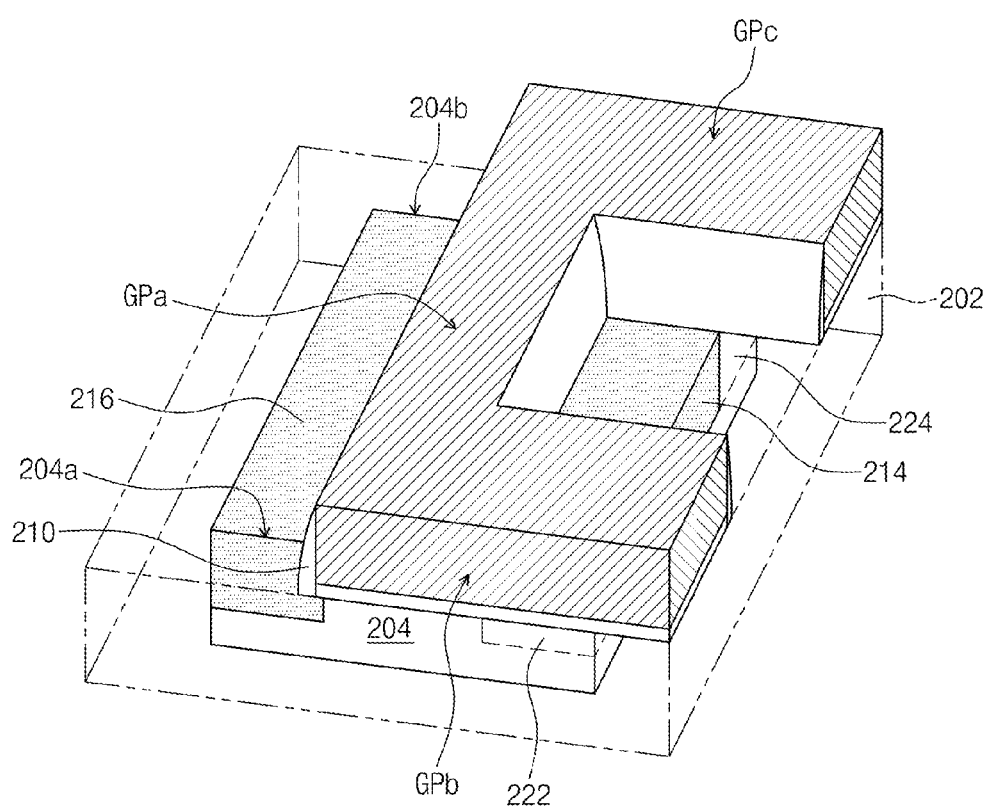
FIG. 12 is a perspective view illustrating a semiconductor device according to a third embodiment of the inventive concept.
Figure 13A:
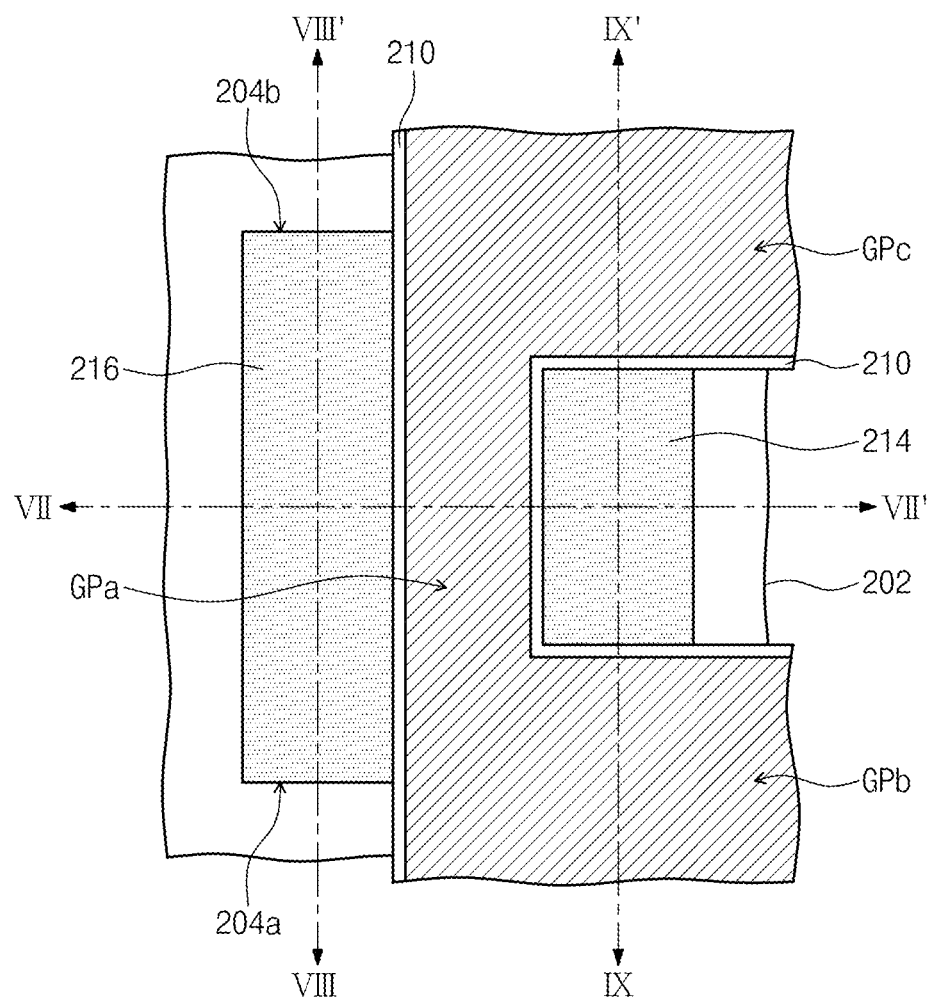
FIGS. 13A through 13D are views illustrating a method of fabricating a semiconductor device according to the third embodiment of the inventive concept.
Figure 13B:
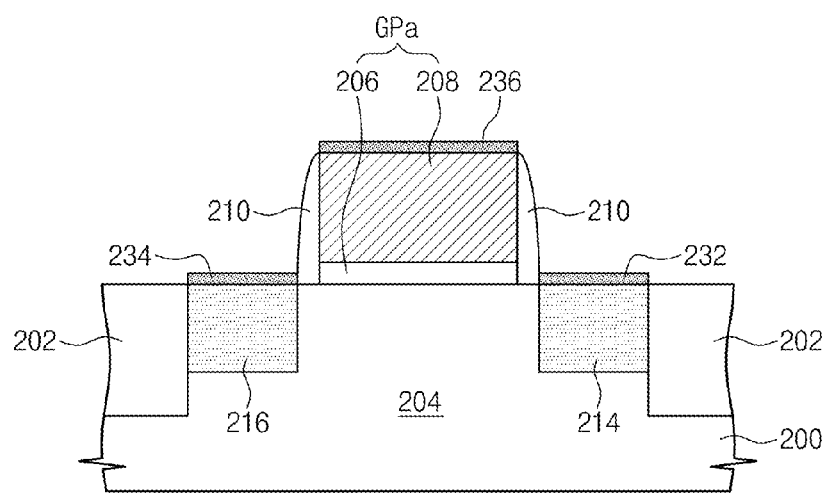
Figure 13C:
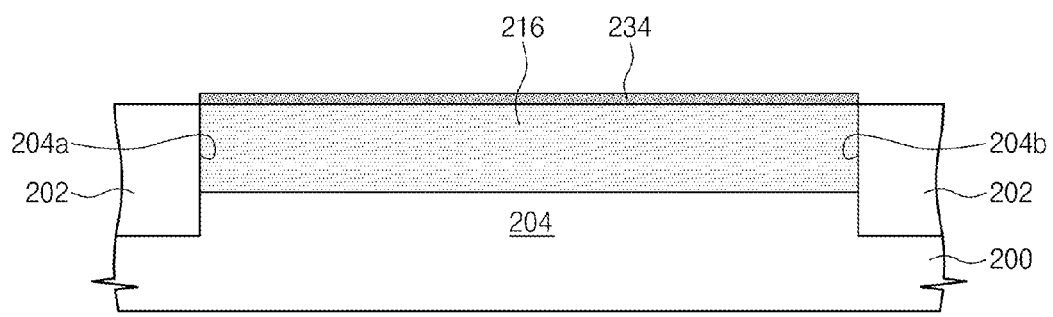
Figure 13D:
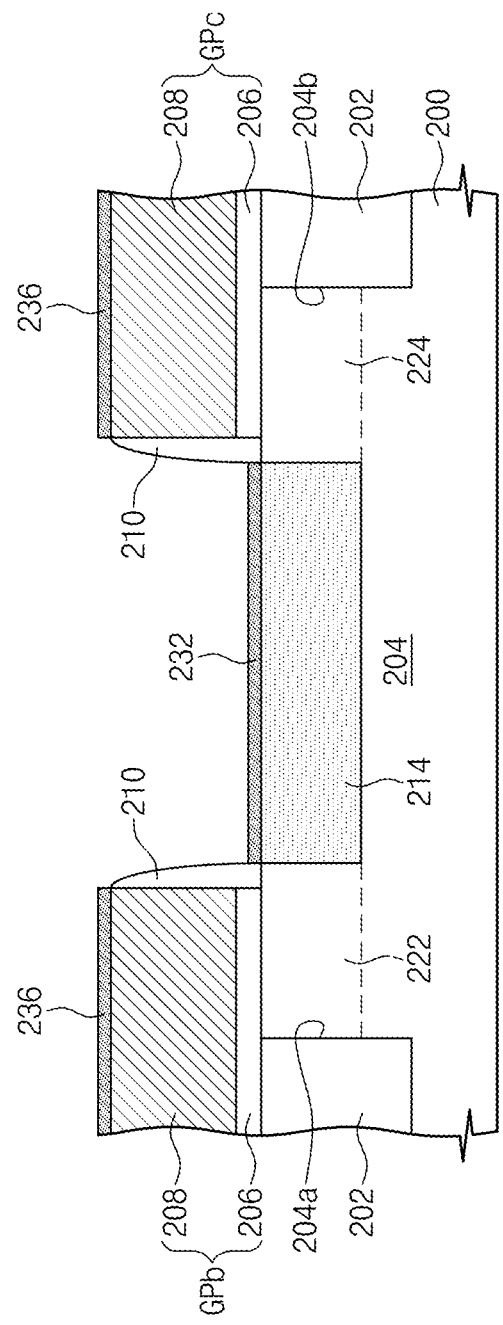

FIGS. 12, 13A through 13D are views illustrating a semiconductor device and fabrication method according to the third embodiment of the inventive concept. More specifically, FIG. 12 is a perspective view illustrating a semiconductor device and fabrication method according to the third embodiment of the inventive concept, FIG. 13A is a plan view illustrating a semiconductor device and fabrication method according to the third embodiment of the inventive concept, and FIGS. 13B through 13D are respective sectional views taken along lines VII-VII', VIII-VIII', and IX-IX' in FIG. 13A. For convenience of description, certain silicide patterns described below are not shown in FIGS. 12 and 13A.

Referring to FIGS. 12, 13A through 13D, a device isolation pattern 202 defining an active portion 204 is disposed on a semiconductor substrate 200 doped with the first conductive type dopant. Active portion 204 is a portion of semiconductor substrate 200 surrounded by device isolation pattern 202. Active portion 204 comprises a first sidewall 204a and a second sidewall 204b extending in parallel in a first direction. First sidewall 204a and second sidewall 204b form a boundary where active portion 204 and device isolation pattern 202 contact each other. Semiconductor substrate 200 can be the same as semiconductor substrate 100 of FIG. 1, and it can be formed through the same method as device isolation pattern 102 described with reference to FIGS. 2A through 2C.

Gate patterns GPa, GPb, and GPc are formed over active portion 204. Gate patterns GPa, GPb, and GPc comprise a main portion GPa extending in a second direction perpendicular to the first direction, and first and second extension portions GPb and GPc extending in the first direction at both ends of main portion GPa.

First and second extension portions GPb and GPc overlap first and second sidewalls 204a and 204b, respectively. First and second extension portions GPb and GPc overlap device isolation pattern 202.

Gate patterns GPa, GPb, and GPc form a gate insulation layer 206 on semiconductor substrate 200 and a gate electrode 208 on gate insulation layer 206. Gate insulation layer 206 and gate electrode 208 are formed of the same material as gate insulation layer 106 and gate electrode 108, respectively, described with reference to FIG. 1.

A first source/drain region 214, a first barrier region 222, and a second barrier region 224 are disposed in active portion 204 at one side of the main portion GPa of gate patterns GPa, GPb, and GPc. First barrier region 222 is disposed between first source/drain region 214 and first sidewall 204a, and second barrier region 224 is disposed between first source/drain region 214 and second sidewall 204b. As a result, first source/drain region 214 is spaced from first sidewall 204a and second sidewall 204b. First barrier region 222, first source/drain region 214, and second barrier region 224 are sequentially disposed from first sidewall 204a. First and second barrier regions 222 and 224 contact first and second sidewalls 204a and 204b, respectively. First and second barrier regions 222 and 224 are disposed below first and second extension portions GPb and GPc so that first extension portion GPb and first barrier region 222 overlaps and second extension portion GPc and second barrier region 224 overlap.

First source/drain region 214 is doped with the second conductive type dopant, and first and second barrier regions 222 and 224 are doped with the first conductive type dopant. First barrier region 222 is a portion of active portion 204 that is not doped with the second conductive type dopant. First barrier region 222 is disposed between first source/drain region 214 and first sidewall 204a. Second barrier region 224 is a portion of active portion 204 that is not doped with the second conductive type dopant and disposed between first source/drain region 214 and second sidewall 204b. Accordingly, a concentration of the first conductive type dopant of first and second barrier regions 222 and 224 is substantially the same as that of active portion 204.

A second source/drain region 216 is disposed in active portion 204 at the other side of main portion GPa of gate patterns GPa, GPb, and GPc. Second source/drain region 216 is doped with the second conductive type dopant. Second source/drain region 216 contacts first sidewall 204a and second sidewall 204b. In the second direction, the length of second source/drain region 216 is longer than that of first source/drain region 214.

First, second and third silicide patterns 232, 234, and 236 are disposed to cover first source/drain region 214, second source/drain region 216, and gate electrode 208, respectively.

Referring to FIGS. 12, 13A through 13D, device isolation pattern 202 is formed in semiconductor substrate 200 to define active portion 204. Later, gate patterns GPa, GPb, and GPc and spacer 210 are formed on semiconductor substrate 200. Gate patterns GPa, GPb, and GPc comprise a gate insulation layer 206 and a gate electrode 208. Spacer 210 is formed through the same method as spacer 110 described with reference to FIGS. 2A through 2D.

Gate patterns GPa, GPb, and GPc comprise main portion GPa extending in the second direction perpendicular to the first direction, and first and second extension portions GPb and GPc extending in the first direction at both ends of main portion GPa.

First extension portion GPb covers a first portion of active portion 204 disposed at one side of the main portion GPa and adjacent to first sidewall 204a. Second extension portion GPc covers a second portion of active portion 204 disposed at the one side of the main portion GPa and adjacent to second sidewall 204b. A portion of active portion 204 between the first portion and the second portion, and a portion of active portion 204 at the other side of the main portion GPa is not covered with the gate patterns GPa, GPb, and GPc.

Dopant ions of the second conductive type are implanted using gate patterns GPa, GPb, and GPc as an ion implantation mask. First and second source/drain regions 214 and 216 are formed by implanting the second conductive dopant on active portion 204 uncovered by gate patterns GPa, GPb, and GPc. More particularly, first source/drain region 214 is formed by doping a portion of active portion 204 between the first portion and the second portion with the second conductive type dopant. Second source/drain region 216 is formed by doping active portion 204 at the other side of main portion GPa of gate patterns GPa, GPb, and GPc with the second conductive type dopant.

The first and second portions of active portion 204 below first extension portion GPb and second extension portion GPc is not doped with the second conductive type dopant. Consequently, first and second barrier regions 222 and 224 doped with the first conductive type dopant are defined respectively between first source/drain region 214 and first sidewall 204a and between first source/drain region 214 and second sidewall 204b.

Later, through a metal silicide process, first through third silicide patterns 232, 234, and 236 are formed to cover first source/drain region 214, second source/drain region 216, and gate electrode 208, respectively.

Figure 14A:
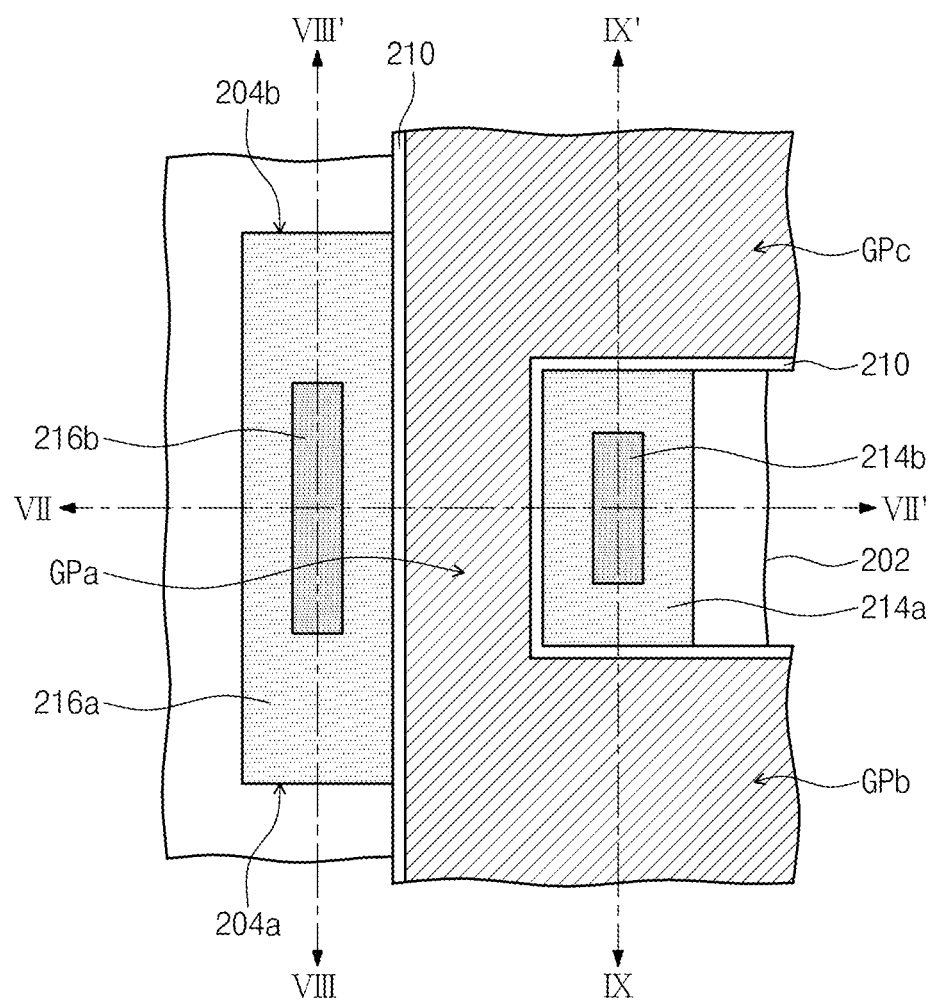
FIGS. 14A through 14D are views illustrating a semiconductor device and fabrication method according to a variation of the third embodiment.
Figure 14B:
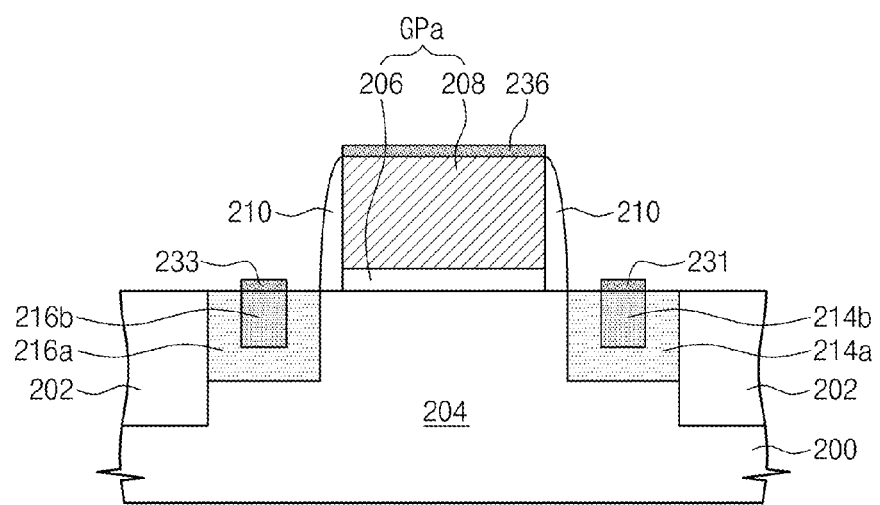
Figure 14C:
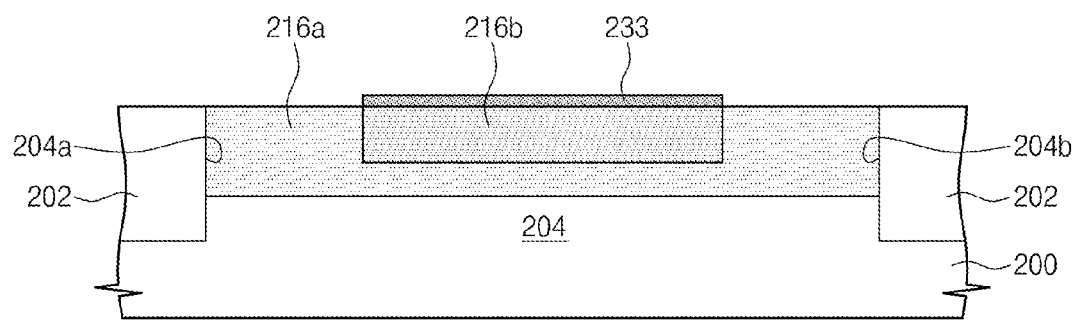
Figure 14D:
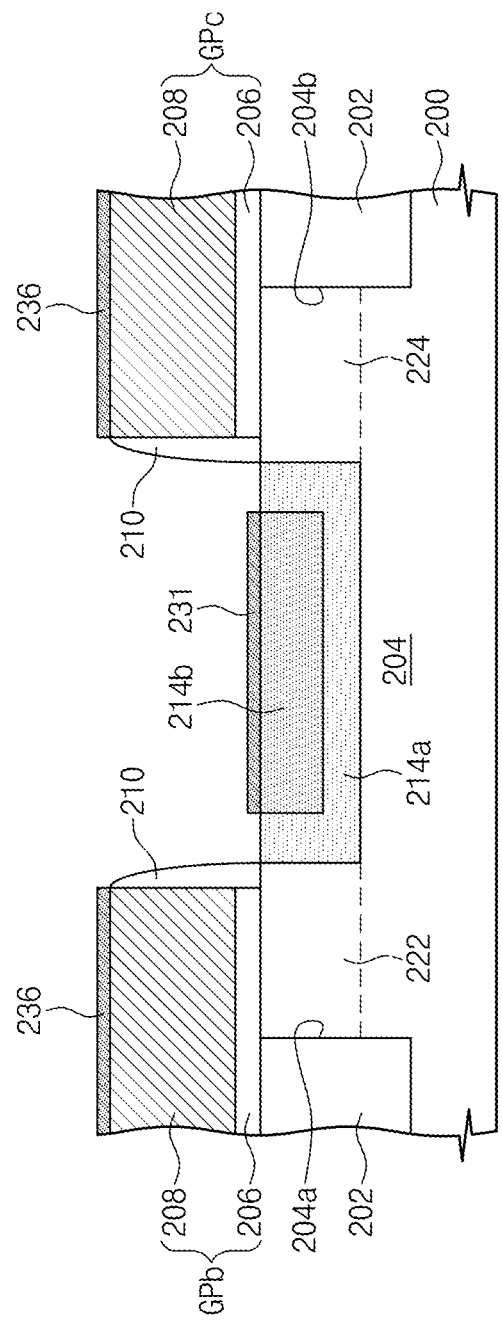

FIGS. 14A through 14D are views illustrating a semiconductor device and fabrication method according to a variation of the third embodiment of the inventive concept. More specifically, FIG. 14A is a plan view illustrating a semiconductor device and fabrication method according to the variation of the third embodiment, and FIGS. 14B through 14D are respective sectional views taken along lines VII-VII', VIII-VIII', and IX-IX' in FIG. 14A. For convenience of description, certain silicide patterns described below are not shown in FIG. 14A.

The method of FIGS. 14A through 14D begins with semiconductor substrate 200, device isolation pattern 202, active portion 204, the gate patterns GPa, GPb, and GPc, and first and second source/drain regions 214 and 216, described with reference to FIGS. 13A through 13D. A mask pattern is formed to expose the middle portions of the first and second source/drain regions 214 and 216 while covering the edge portions of first and second source/drain regions 214 and 216. Using the mask pattern as an ion implantation mask, the second conductive type dopant is further implanted on the middle portions of first and second source/drain regions 214 and 216. This process forms first source/drain regions 214a and 214b comprising a first low concentration doping region 214a and first high concentration doping region 214b in first low concentration doping region 214a are formed. The process also forms second source/drain regions 216a and 216b comprising a second low concentration doping region 216a and a second high concentration region 216b in second low concentration doping region 216a. First and second low concentration doping regions 214a and 216a are portions of first and second source/drain regions 214 and 216 into which the second conductive type dopant is no further doped due to the covering provided by the mask pattern. First and second high concentration doping regions 214b and 216b can also be portions of first and second source/drain regions 214 and 216 into which the second conductive type dopant is further doped.

First through third silicide patterns 231, 233, and 236 are formed to cover first high concentration doping region 214b, second high concentration doping region 216b, and gate electrode 208, respectively. First silicide pattern 231 covers high concentration doping region 214b and does not cover first low concentration doping region 214a. Second silicide pattern 233 covers second high concentration doping region 216b and does not cover second low concentration doping region 216a. For example, first through third silicide patterns 231, 233, and 236 can be formed through a metal silicide process using a blocking mask pattern as a mask. In this case, the blocking mask pattern can be formed to cover the first and second low concentration doping regions 216a and 214a and expose gate electrode 208 and first and second high concentration doping regions 216a and 214b.

Figure 15:
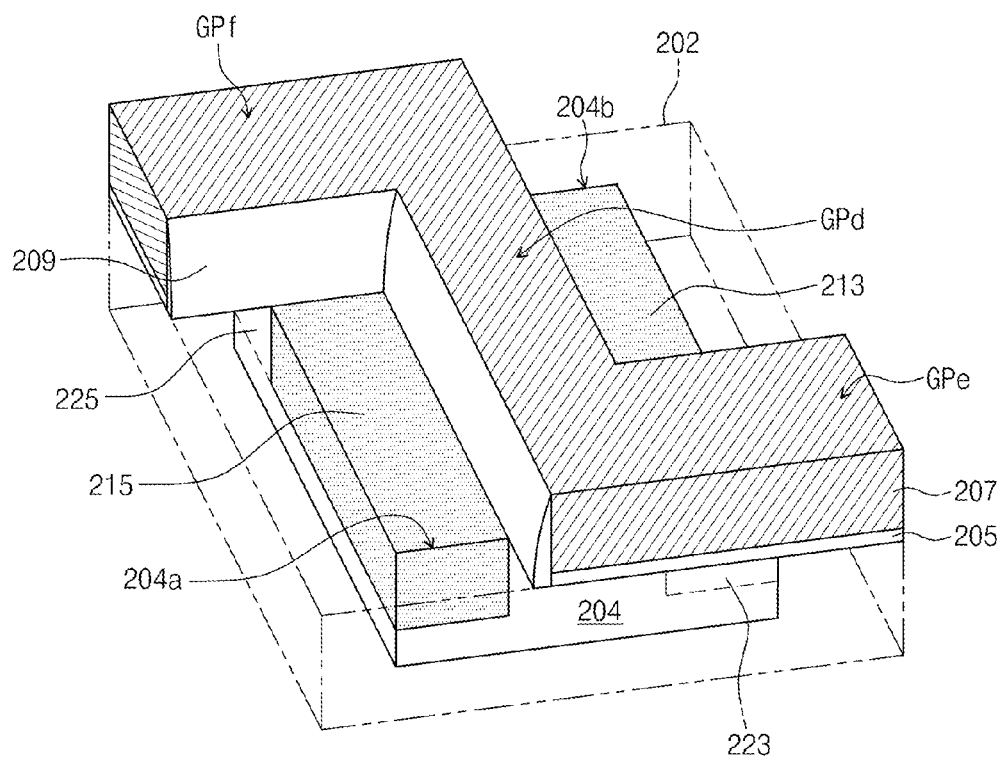
FIG. 15 is a perspective view illustrating a semiconductor device according to a fourth embodiment of the inventive concept.
Figure 16A:
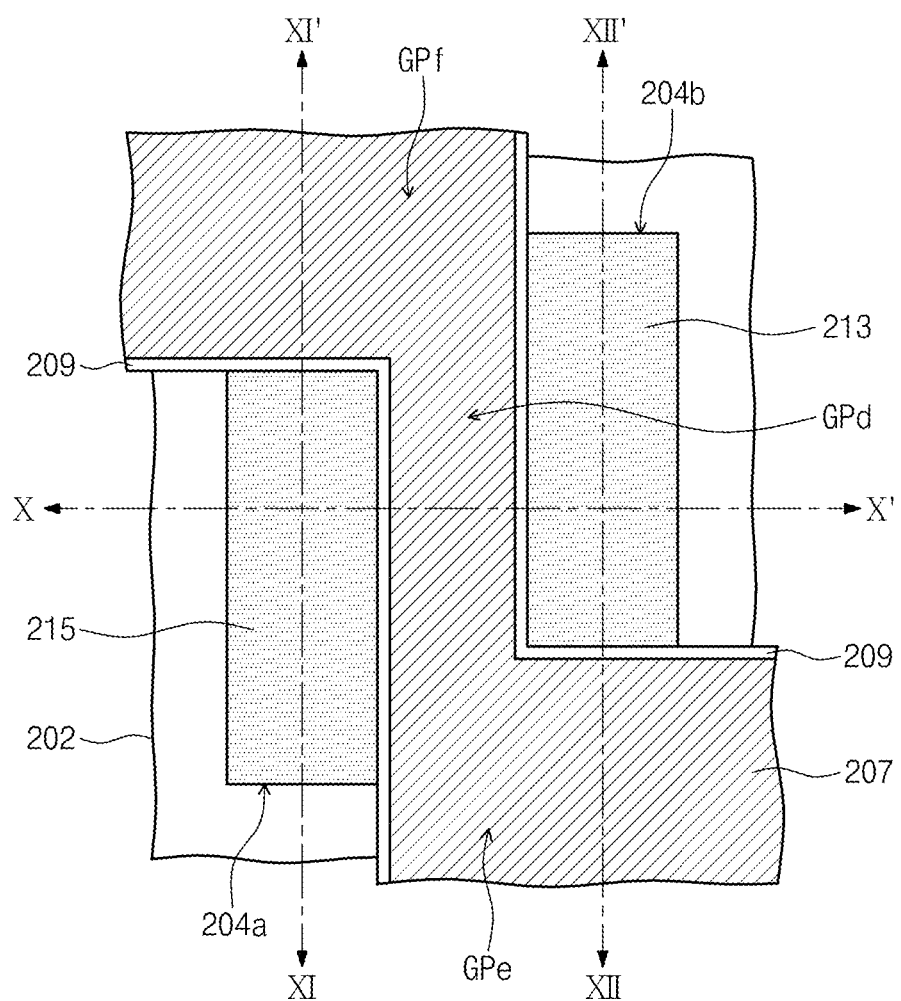
FIGS. 16A through 16D are views illustrating a method of fabricating a semiconductor device according to the fourth embodiment of the inventive concept.
Figure 16B:
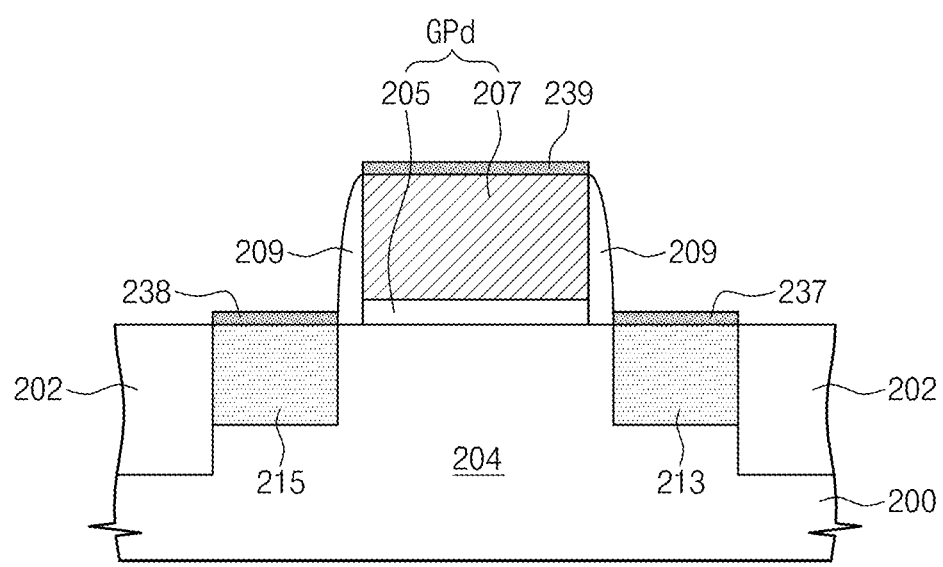
Figure 16C:
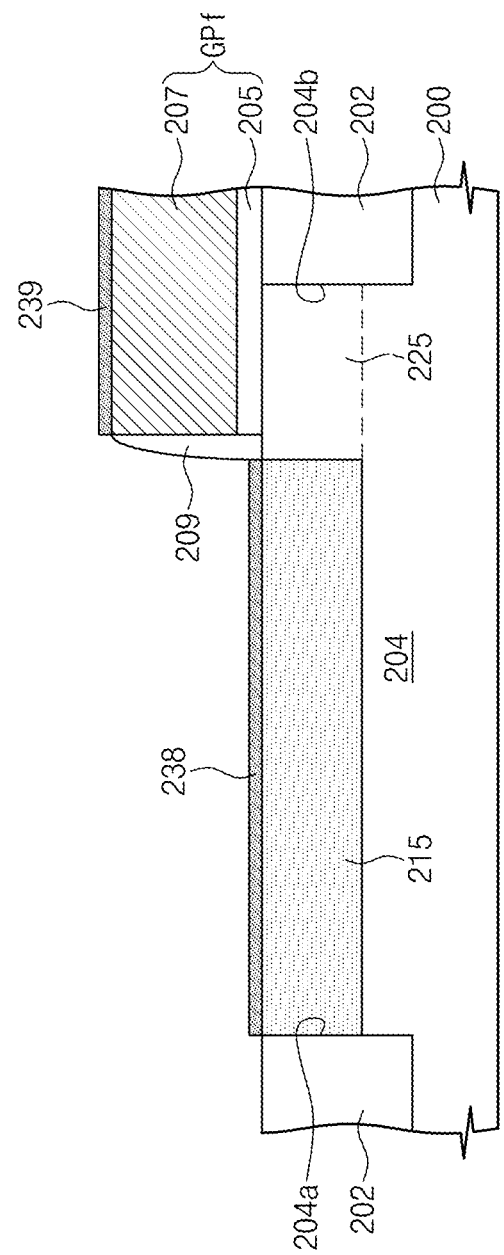
Figure 16D:
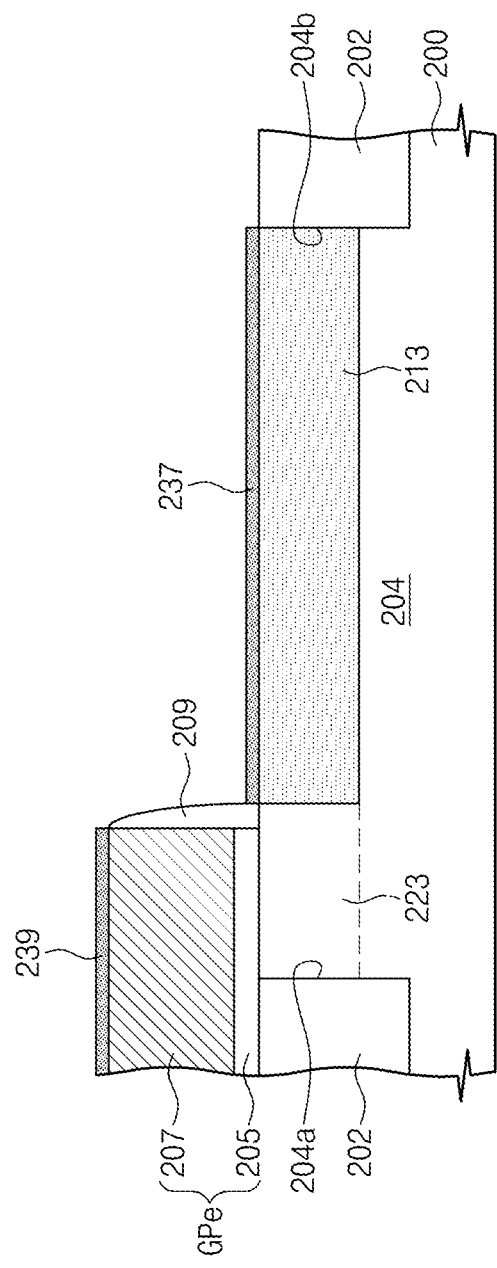

FIGS. 15, 16A through 16D are views illustrating a semiconductor device and fabrication method according to the fourth embodiment of the inventive concept. More specifically, FIG. 15 is a perspective view illustrating a semiconductor device and fabrication method according to the fourth embodiment of the inventive concept. FIG. 16A is a plan view illustrating a semiconductor device and fabrication method according to the fourth embodiment of the inventive concept. FIGS. 16B through 16D are sectional views taken along lines X-X', XI-XI', and XII-XII' in FIG. 16A. For convenience of description, certain silicide patterns described below are not shown in FIGS. 15 and 16A.

The method of FIGS. 15 and 16A through 16D begins with semiconductor substrate 200, device isolation pattern 202, and active portion 204 of FIGS. 13A through 13D. Active portion 204 comprises first and second sidewalls 204a and 204b extending in parallel in a first direction.

Gate patterns GPd, GPe, and GPf are formed over active portion 204. Gate patterns GPd, GPe, and GPf comprise main portion GPd extending a second direction perpendicular to the first direction, first extension portion GPe extending in the first direction at one end of main portion GPd, and second extension portion GPf extending in an antiparallel direction to the first direction at the other end of main portion GPd.

First and second extension portions GPe and GPf overlap first and second sidewalls 204a and 204b, respectively. First and second extension portions GPe and GPf overlap device isolation pattern 202.

Gate patterns GPd, GPe, and GPf comprise a gate insulation layer 205 on semiconductor substrate 200 and a gate electrode 207 on gate insulation layer 205. Gate insulation layer 205 and gate electrode 207 are formed of the same material as those 106 and 108, respectively, described with reference to FIG. 1.

A first source/drain region 213 and a first barrier region 223 are disposed in active portion 204 at one side of main portion GPd of gate patterns GPd, GPe, and GPf. A second source/drain region 215 and a second barrier region 225 are disposed in active portion 204 at the other side of main portion GPd of gate patterns GPd, GPe, and GPf. First barrier region 223 is disposed between first source/drain region 213 and first sidewall 204a. Second barrier region 225 is disposed between the second source/drain region 215 and second sidewall 204b. First and second barrier regions 223 and 225 contact first and second sidewalls 204a and 204b. First and second barrier regions 223 and 225 are disposed below first and second extension portions GPe and GPf, respectively, so that first barrier region 223 overlaps first extension portion GPe and second barrier region 225 overlaps second extension portion GPf.

First and second source/drain regions 213 and 215 are doped with the second conductive type dopant, and first and second barrier regions 223 and 225 are doped with the first conductive type dopant. First barrier region 223 is a portion of active portion 204 into which the second conductive type dopant is not doped. It is disposed between first source/drain region 213 and first sidewall 204a. Second barrier region 225 is a portion of active portion 204 into which the second conductive type dopant is not doped. It is disposed between second source/drain region 215 and second sidewall 204b. Accordingly, a concentration of the first conductive type dopant of first and second barrier regions 223 and 225 is substantially the same as that of active portion 204.

First, second, and third silicide patterns 237, 238, and 239 are disposed to cover first source/drain region 213, second source/drain region 215, and gate electrode 207, respectively.

Referring to FIGS. 15 and 16A through 16D, a device isolation pattern 202 defining active portion 204 is disposed on semiconductor substrate 200. Later, gate patterns GPd, GPe, and GPf and spacer 210 are formed on semiconductor substrate 200. Gate patterns GPd, GPe, and GPf comprise gate insulation layer 206 and gate electrode 208. Spacer 210 is formed through the same method as spacer 110 described with reference to FIGS. 2A through 2D. Gate patterns GPd, GPe, and GPf comprise main portion GPd extending in the second direction perpendicular to the first direction, first extension portion GPe extending in the first direction at one end of main portion GPd, and second extension portion GPf extending in an antiparallel direction to the first direction at the other end of main portion GPd.

First extension portion GPe covers a first portion of active portion 204, which is disposed at one side of main portion GPd and adjacent to first sidewall 204a. A portion of active portion 204 between second sidewall 204b and the first portion is not covered. Second extension portion GPf covers a second portion of active portion 204 disposed at the other side of main portion GPd and adjacent to second sidewall 204b. A portion of active portion 204 between first sidewall 204a and the second portion is not covered. Gate patterns GPd, GPe, and GPf comprise gate insulation layer 205 on semiconductor substrate 200 and gate electrode 207 on gate insulation layer 205.

Dopant ions of the second conductive type are implanted using gate patterns GPd, GPe, and GPf as an ion implantation mask. The second conductive dopant is implanted in active portion 204 to form first and second source/drain regions 213 and 215. First source/drain region 213 is formed by doping a portion of active portion 204 at the one side of main portion GPd with the second conductive type dopant. Second source/drain region 215 is formed by doping a portion of active portion 204 at the other side of main portion GPd with the second conductive type dopant.

The first and second portions of active portion 204 below first extension portion GPe and second extension portion GPf are not doped with the second conductive type dopant. Therefore, a first barrier region 223 doped with the first conductive type dopant is defined between the first source/drain region 213 and first sidewall 204a and also, a second barrier region 225 doped with the first conductive type dopant is defined between the second source/drain region 215 and second sidewall 204b. First and second barrier regions 223 and 225 define a portion of active portion 204 into which the second conductive type dopant is not doped. A concentration of the first conductive type dopant of first and second barrier region s223 and 225 is substantially the same as that of active portion 204.

Later, through a metal silicide process, first, second, and third silicide patterns 237, 238, and 239 are formed to cover first source/drain region 213, second source/drain region 215, and gate electrode 208, respectively.

Figure 17A:
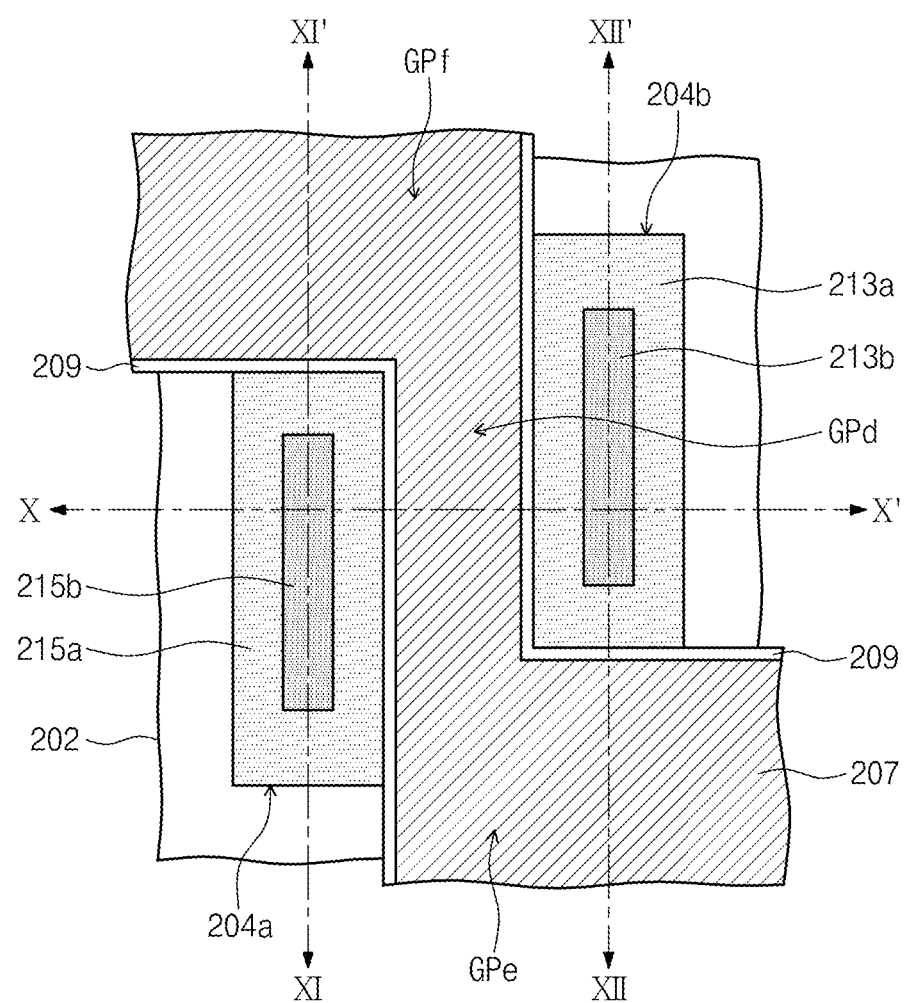
FIGS. 17A through 17D are views illustrating a semiconductor device and fabrication method according to a variation of the fourth embodiment.
Figure 17B:
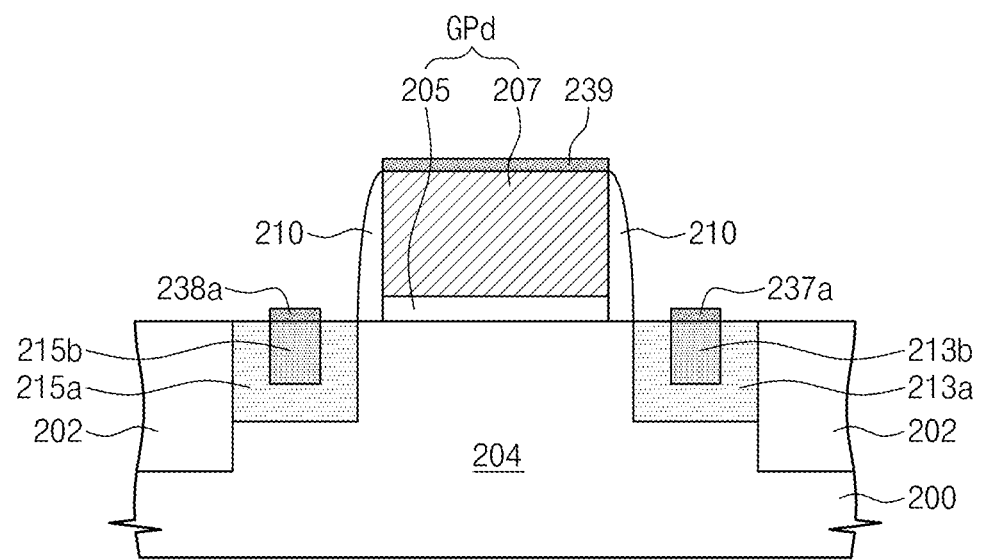
Figure 17C:
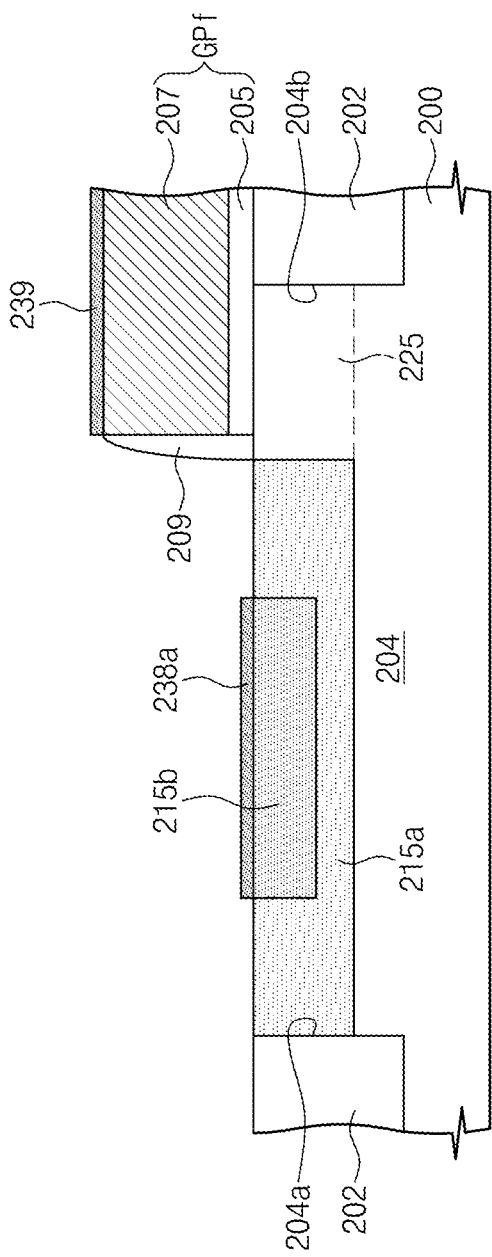
Figure 17D:
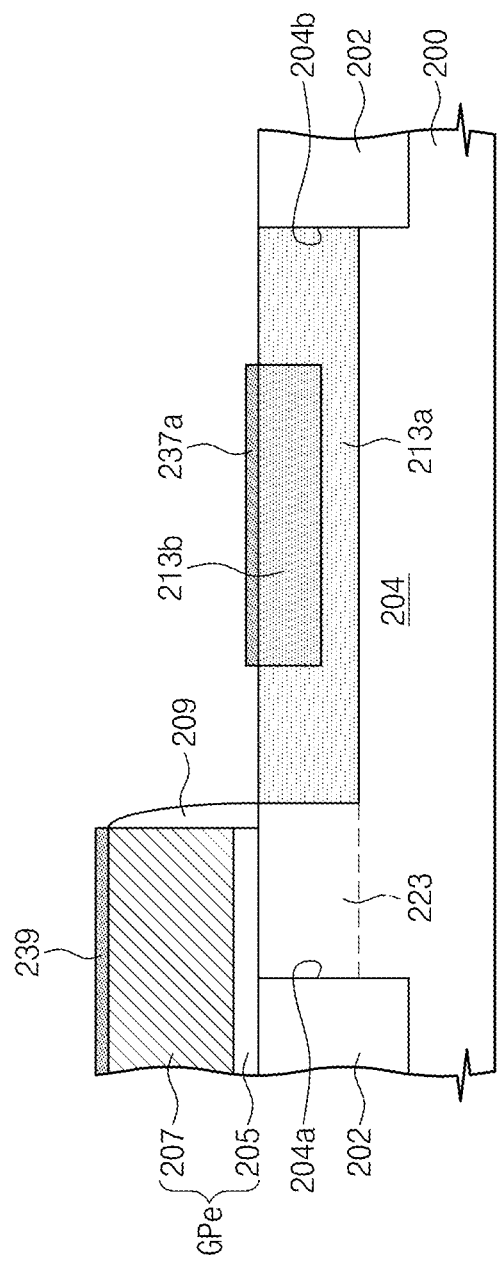

FIGS. 17A through 17D are views illustrating a semiconductor device and fabrication method according to a variation of the fourth embodiment of the inventive concept. More specifically, FIG. 17A is a plan view illustrating a semiconductor device and fabrication method according to the variation of the fourth embodiment, and FIGS. 17B through 17D are respective sectional views taken along lines X-X', XI-XI', and XII-XII' in FIG. 17A. For convenience of description, certain silicide patterns described below are not shown in FIG. 17A.

The method of FIGS. 17A through 17D begins with semiconductor substrate 200, device isolation pattern 202, active portion 204, gate patterns GPd, GPe, and GPf, and first and second source/drain regions 213 and 215 of FIGS. 14A through 14D. A mask pattern is formed to expose the middle portions of first and second source/drain regions 213 and 215 while covering the edge portions of first and second source/drain regions 213 and 215. Using the mask pattern as an ion implantation mask, the second conductive type dopant is further implanted in the middle portions of first and second source/drain regions 213 and 215. This process forms first source/drain regions 213a and 213b comprising a first low concentration doping region 213a and first high concentration doping region 215b in first low concentration doping region 213a are formed. The process also forms second source/drain regions 215a and 215b comprising a second low concentration doping region 215a and a second high concentration region 215b in second low concentration doping region 215a. First and second low concentration doping regions 213a and 215a are portions of the first and second source/drain regions 213 and 215 into which the second conductive type dopant is not further implanted due to the mask pattern, and first and second high concentration doping regions 213b and 215b are portions of first and second source/drain regions 213 and 215 into which the second conductive type dopant is further implanted.

First through third silicide patterns 237, 238, and 239 are formed to cover first high concentration doping region 213b, second high concentration doping region 215b, and gate electrode 208, respectively. First silicide pattern 237 covers high concentration doping region 213b and it does not cover first low concentration doping region 213a. Second silicide pattern 238 covers second high concentration doping region 215b and it does not cover second low concentration doping region 215a. For example, first through third silicide patterns 237, 238, and 239 can be formed through a metal silicide process using a blocking mask pattern as a mask. In this case, the blocking mask pattern can be formed to cover the first and second low concentration doping regions 213a and 215a and to expose gate electrode 207 and first and second high concentration doping regions 213a and 215b.

The above-described semiconductor devices can be placed in a variety of packages or package configurations. For example, they can be placed in packages such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flat-pack (TQFP), system in package (SIP), multi chip package (MCP), wafer-level fabricated package (WFP), and wafer-level processed stack package (WSP).

As indicated by the foregoing, in certain embodiments of the inventive concept, an active portion comprises first and second sidewalls, and a source/drain region and a barrier region are formed in the active portion at one side of the gate pattern. The barrier region is disposed between the active portion and the first sidewall to contact the first sidewall. Therefore, the source/drain region is spaced apart from the first sidewall so that a highly reliable semiconductor device can be realized.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A semiconductor device, comprising:
a semiconductor substrate;
a device isolation pattern defining an active portion in the semiconductor substrate, the active portion having first and second sidewall surfaces each extending in a first direction, the first and second sidewall surfaces being in face to face contact with surfaces of the device isolation pattern at opposite ends of the active portion, respectively; and
a gate pattern extending in a second direction, perpendicular to the first direction, over and across the first and second sidewall surfaces of the active portion so as to also overlap the device isolation pattern; and
wherein the active portion of the substrate comprises a first source/drain region and a first barrier region disposed to one side of the gate pattern,
the first barrier region is interposed, in the second direction, between the first source/drain region and part of the device isolation pattern that contacts the first sidewall surface; and
the first barrier region is a doped region of a first conductivity type and the first source/drain region is a doped region of a second conductivity type opposite the first conductivity type.

2. The semiconductor device of claim 1, wherein the active portion also comprises a channel region below the gate pattern, the channel region is a doped region of the first conductivity type, and the first barrier region contains a higher concentration of dopant of the first conductivity type than the channel region.

3. The semiconductor device of claim 1, wherein the active portion also comprises a second barrier region disposed to the one side of the gate pattern,
the second barrier region is interposed, in the second direction, between the first source/drain region and part of the device isolation pattern that contacts the second sidewall surface, and
the second barrier region is a doped region of the first conductivity type.

4. The semiconductor device of claim 3, wherein the active portion also comprises a second source/drain region disposed to another side of the gate pattern opposite the one side of the gate pattern,
the second source/drain region is a doped region of the second conductivity type, and
the second source/drain region contacts the device isolation pattern at the opposite ends of the active portion.

5. The semiconductor device of claim 3, wherein the active portion also comprises a second source/drain region, a third barrier region, and a fourth barrier region disposed to another side of the gate pattern opposite the one side of the gate pattern,
the second source/drain region is a doped region of the second conductivity type,
the third barrier region is interposed, in the second direction, between the second source/drain region and part of the device isolation pattern that contacts the first sidewall surface,
the fourth barrier region is interposed, in the second direction, between the second source/drain region and part of the device isolation pattern that contacts the second sidewall surface, and
the third and fourth barrier regions are doped regions of the first conductivity type.

6. The semiconductor device of claim 1, wherein the first source/drain region comprises a low concentration doping region, and a high concentration doping region disposed in the low concentration doping region and containing a higher concentration of dopant of the second conductivity type than the low concentration doping region.

7. The semiconductor device of claim 6, further comprising a silicide pattern covering the high concentration doping region.

8. The semiconductor device of claim 6, wherein the active portion also comprises a second barrier region disposed to the one side of the gate pattern,
the second barrier region is interposed, in the second direction, between the first source/drain region part of the the device isolation pattern that contacts the second sidewall surface, and
the second barrier region is a doped region of the first conductivity type; and further comprising:
a silicide pattern covering the low concentration doping region, the high concentration doping region, and the first and second barrier regions, and
wherein the active portion also comprises a channel region below the gate pattern,
the channel region is a doped region of the first conductivity type, and
the first and second barrier regions each have a higher concentration of dopant of the first conductivity type than the channel region.

9. The semiconductor device of claim 1, wherein the gate pattern comprises a main portion extending in the second direction and a first extension portion extending from one end of the main portion in the first direction; and
the first extension portion overlaps the first barrier region.

10. The semiconductor device of claim 9, wherein the active portion also comprises a second barrier region disposed to the one side of the gate pattern,
the second barrier region is interposed, in the second direction, between the first source/drain region and part of the device isolation layer that contacts the second sidewall surface,
the second barrier region is a doped region of the first conductivity type,
the gate pattern further comprises a second extension portion extending in the first direction from another end of the main portion opposite the one end of the main portion, and
the second extension portion overlaps the second barrier region.

11. The semiconductor device of claim 9, wherein the active portion also has a second source/drain region and a second barrier region disposed to another side of the gate pattern opposite the one side of the gate pattern,
- the second barrier region is interposed, in the second direction, between the second source/drain region and part of the device isolation layer that contacts the second sidewall surface,
- the second barrier region is a doped region of the first conductivity type,
- the second source/drain region is a doped region of the second conductivity type,
- the gate pattern further comprises a second extension portion extending from the another end of the main portion in an antiparallel direction to the first direction, and
- the second extension portion overlaps the second barrier region.

12. The semiconductor device of claim 11, wherein the first extension portion and the second extension portion overlap the device isolation pattern.

13. The semiconductor device of claim 1, wherein the first barrier region constitutes part of the first sidewall surface contacted by the device isolation pattern.

14. A transistor, comprising:
- a semiconductor substrate including an active portion having first and second sidewall surfaces constituting first and second opposite ends of the active portion, respectively, the first and second sidewall surfaces extending parallel to one another in a first direction; and
- a gate pattern disposed on the active portion and extending in a second direction perpendicular to the first direction, and
- wherein the active portion comprises a first source/drain region located on a first side of the gate pattern,
- a second source/drain region located on a second side of the gate pattern;
- a first barrier region occupying a region between the first source/drain region and the end of the active portion that is constituted by the first sidewall surface of the active portion, and
- a second barrier region occupying a region between the first source/drain region and the end of the active portion that is constituted by the second sidewall surface of the active portion.

15. The transistor of claim 14, wherein the first and second barrier regions, and the active portion are doped regions of a first conductivity type, and the first source/drain region is a doped region of a second conductivity type opposite the first conductivity type.

16. The transistor of claim 14, wherein the active portion also comprises a channel region below the gate pattern, and the first and second barrier regions each have substantially the same concentration of dopant of the first conductivity type as the channel region.

17. The transistor of claim 14, wherein the active portion also comprises a channel region below the gate pattern, and the first and second barrier regions each have a higher concentration of dopant of the first conductivity type than the channel region.

18. The transistor of claim 14, wherein the second source/drain region is a doped region of the second conductivity type and it extends from one of the opposite ends of the active portion to the other so as to constitute parts of both the first sidewall surface and the second sidewall surface.

19. The transistor of claim 14, wherein the first and second barrier regions constitute parts of the first and second sidewall surfaces, respectively.

* * * * *